United States Patent
Virtanen et al.

(10) Patent No.: US 9,325,053 B2
(45) Date of Patent: Apr. 26, 2016

(54) METHOD FOR PRODUCING A RADIO FREQUENCY IDENTIFICATION (RFID) TRANSPONDER

(75) Inventors: Juhani Virtanen, Tampere (FI); Matti Tavilampi, Tampere (FI)

(73) Assignee: Smartrac IP B.V., Amsterdam (NL)

( * ) Notice: Subject to any disclaimer, the term of this patent is extended or adjusted under 35 U.S.C. 154(b) by 235 days.

(21) Appl. No.: 13/884,008

(22) PCT Filed: Nov. 8, 2011

(86) PCT No.: PCT/FI2011/050990
§ 371 (c)(1),
(2), (4) Date: Jul. 17, 2013

(87) PCT Pub. No.: WO2012/062965
PCT Pub. Date: May 18, 2012

(65) Prior Publication Data
US 2013/0291375 A1 Nov. 7, 2013

Related U.S. Application Data

(60) Provisional application No. 61/410,987, filed on Nov. 8, 2010.

(51) Int. Cl.
*H01P 11/00* (2006.01)
*H01Q 13/00* (2006.01)
*B23K 26/38* (2014.01)
*G06K 19/077* (2006.01)
*B23K 26/40* (2014.01)
*H01Q 1/38* (2006.01)

(52) U.S. Cl.
CPC .............. *H01P 11/003* (2013.01); *B23K 26/38* (2013.01); *B23K 26/40* (2013.01); *G06K 19/07754* (2013.01); *G06K 19/07773* (2013.01); *H01Q 1/38* (2013.01); *B23K 2201/36* (2013.01); *H01L 2224/16225* (2013.01); *H01L 2224/16227* (2013.01); *H01L 2224/293* (2013.01);
(Continued)

(58) Field of Classification Search
CPC ...... B23K 26/00; B23K 26/206; B23K 26/22; B23K 26/367; B23K 26/383; G06K 19/0725; G06K 19/0726; G06K 19/0775; G06K 19/07773; G06K 19/07775; G06K 19/07777; G06K 19/07781; G06K 19/07794; G06K 19/07798; Y10T 29/49002; Y10T 29/49016; Y10T 29/49018
USPC ............ 29/600, 601, 605, 606; 343/728, 741, 343/764, 748, 750, 866
See application file for complete search history.

(56) References Cited

U.S. PATENT DOCUMENTS 7,709,294 B2 * 5/2010 Clare et al. .................... 438/111
8,430,324 B2 * 4/2013 Baba et al. .................... 235/492
(Continued)

FOREIGN PATENT DOCUMENTS

DE 19758057 C1 5/1999
EP 1170695 A1 1/2002

OTHER PUBLICATIONS

Supplementary European Search Report—Jun. 16, 2014 (Issued in Counterpart Application No. 11839058.2).
(Continued)

*Primary Examiner* — Paul D Kim
(74) *Attorney, Agent, or Firm* — Venable LLP; Eric J. Franklin

(57) ABSTRACT

A method for producing an RFID transponder. An RFID chip is attached onto a conductive sheet. A portion of an antenna element is cut from the conductive sheet using a laser beam after the RFID chip has been attached to the conductive sheet.

15 Claims, 28 Drawing Sheets

(52) U.S. Cl.
CPC ............... *H01L2224/2929* (2013.01); *H01L 2224/81191* (2013.01); *H01L 2224/81903* (2013.01); *H01L 2224/83851* (2013.01); *H01L 2924/00011* (2013.01); *Y10T 29/49018* (2015.01)

(56) References Cited

U.S. PATENT DOCUMENTS

| | | |
|---|---|---|
| 2007/0094862 A1 | 5/2007 | Posamentier |
| 2007/0130754 A1 | 6/2007 | Fein |
| 2007/0193021 A1* | 8/2007 | Kobayashi et al. ............. 29/601 |
| 2008/0001759 A1* | 1/2008 | Kobayashi et al. ........ 340/572.7 |
| 2008/0047130 A1 | 2/2008 | Lin et al. |
| 2009/0115611 A1* | 5/2009 | Kobayashi et al. ........ 340/572.1 |
| 2015/0024523 A1* | 1/2015 | Virtanen ......................... 438/26 |

OTHER PUBLICATIONS

PCT/ISA/210—International Search Report—Feb. 14, 2012 (Issued in PCT/FI2011/050990).

PCT/ISA/237—Written Opinion of the International Searching Authority—Feb. 14, 2012 (Issued in PCT/FI2011/050990).

\* cited by examiner

METHOD FOR PRODUCING A RADIO FREQUENCY IDENTIFICATION (RFID) TRANSPONDER

CROSS-REFERENCE TO RELATED APPLICATIONS

This application claims priority to U.S. provisional patent application filed 8 Nov. 2010 and is the national phase of PCT/FI2011/050990 filed 8 Nov. 2011.

FIELD OF THE INVENTION

Some versions relate to RFID transponders.

BACKGROUND

Radio frequency identification (RFID) tags may be attached or otherwise associated with items in order to identify the items and/or to track movements of the items. Information stored in the tags may be read in a wireless manner by using a portable or stationary reader.

A radio frequency identification tag comprises a transponder, which responds to an interrogation signal by transmitting a response. The response transmitted from the tag to a reader may contain information, which specifies e.g. an identification number of the item associated with the tag. The tag may be attached to an item by optional attachment means.

RFID tags may be attached to an item in order to provide wireless identification of the item. An RFID tag may specify e.g. a serial number of the item, manufacturing batch of the item and/or a price of the item. An RFID tag may comprise a transponder, which in turn may comprise one or more antenna elements 10a, 10b and an RFID chip.

Referring to FIG. 1, the antenna elements 10a, 10b may be produced on a substrate 90 by chemical etching. The substrate 90 may be e.g. PET (Polyethylene terephthalate). After the final shape of the antenna elements 10a, 10b has been etched, an RFID chip 50 may be attached to the antenna elements 10a, 10b e.g. by using anisotropically conductive adhesive.

Precise positioning of the RFID chip with respect to the terminal parts 12a, 12b of the antenna elements 10a, 10b may be required in order to ensure consistent radio frequency performance.

SUMMARY

Some versions relate to a method for producing an RFID transponder. Some versions relate to providing an apparatus for producing RFID transponders. Some versions relate to providing an RFID transponder.

According to a first aspect, there is provided a method for producing an RFID transponder, the method including:
attaching an RFID chip onto a conductive sheet, and
cutting a portion of an antenna element from the conductive sheet by using a laser beam after the RFID chip has been attached to the conductive sheet.

According to a second aspect, there is provided an apparatus for producing an RFID transponder, wherein the apparatus is arranged:
to attach an RFID chip onto a conductive sheet, and
to cut a portion of an antenna element from the conductive sheet by using a laser beam after the RFID chip has been attached to the conductive sheet.

The RFID chip is mounted on the antenna elements before the final shape of the antenna elements is cut. This may facilitate accurate positioning of the chip 50 with respect to the antenna elements.

Accurate positioning of the chip with respect to the conductive sheet is not critical during the bonding. Thus the chip may be mounted on the antenna elements faster and/or without using expensive adhesives.

The electrical signals provided by the antenna elements of an RFID tag may be very weak. The impedance of the electrical contact between the chip 50 and the antenna element may be critical. Thanks to the invention, consistent and reliable RFID operation may be provided.

In particular, the method for producing an RFID transponder may comprise (see FIG. 2b):
forming a first electrical connection between a first contact element 52a of a chip 50 and a conductive sheet 70,
forming a second electrical connection between a second contact element 52a of the chip 50 and the conductive sheet 70, and
cutting a region of the conductive sheet 70 located between said contact elements 52a, 52b by heating and/or ablating the conductive material of the sheet 70 with the laser beam LB1 after the electrical connections have been formed, so as to (accurately) define the locations of the terminal portions 12a, 12b of the antenna elements with respect to the contact elements 52a, 52b.

Cutting the conductive sheet 70 between the contact elements 52a, 52b may involve a risk of damaging the chip 50 with the laser beam LB1. Said risk may be substantially reduced when the laser beam LB1 is arranged to propagate through the groove cut in the conductive sheet 70 such that the intensity of laser radiation at the surface of the chip 50 is lower than 10% of the maximum intensity used for cutting the conductive sheet 70, preferably lower than 1%. In particular, the geometry of the beam LB1, the orientation of the beam LB1, the cutting pattern (i.e. shape and dimensions of the terminal portions 12a, 12b), and/or the materials in the optical path of the laser beam LB1 may be selected such that intensity of laser radiation at the surface of the chip 50 may be kept in a safe range.

In an embodiment, the antenna elements of an RFID transponder are not attached to a substrate sheet, i.e. the RFID transponder has a substantially substrateless antenna. For example, less than 20% of the surface area of the antenna element (10a, 10b, CA1) may be covered by a dielectric material.

In an embodiment, less waste material may be produced during manufacturing of RFID transponders.

In an embodiment, cheaper face and cover materials may be used in an RFID tag.

In an embodiment, the RFID transponder may be directly attached to an item, i.e. the surface of the item may be arranged to act as a support for the antenna element of the RFID transponder.

In an embodiment, lower manufacturing costs may be expected.

In an embodiment, dimensions and/or shapes of the antenna elements produced by a manufacturing apparatus may be rapidly changed.

Certain issues have to be solved when producing antenna elements which are not attached to a substrate sheet. One of the most challenging issues is maintaining the form and dimensions of the antenna elements during cutting of the elements and during transferring the elements. The form may be maintained e.g. by using links, bridges and/or by using a holding member.

In an embodiment, the antenna element is connected to an outer portion of a conductive sheet by the links. The links help to maintain the correct form of the antenna element during cutting of the shape of the antenna element. After cutting, the antenna element may be separated from the remaining portion of the conductive sheet, e.g. by breaking the links.

When the antenna element is e.g. a coil comprising a plurality of turns, the the correct position of the turns with respect to each other may be maintained by bridge elements. After cutting, the antenna element may be torn away from the remaining portion of the conductive sheet, e.g. by breaking a few dielectric bridges.

BRIEF DESCRIPTION OF THE DRAWINGS

In the following examples, various embodiments will be described in more detail with reference to the appended drawings, in which.

All drawings are schematic.

DETAILED DESCRIPTION

Figure 1:
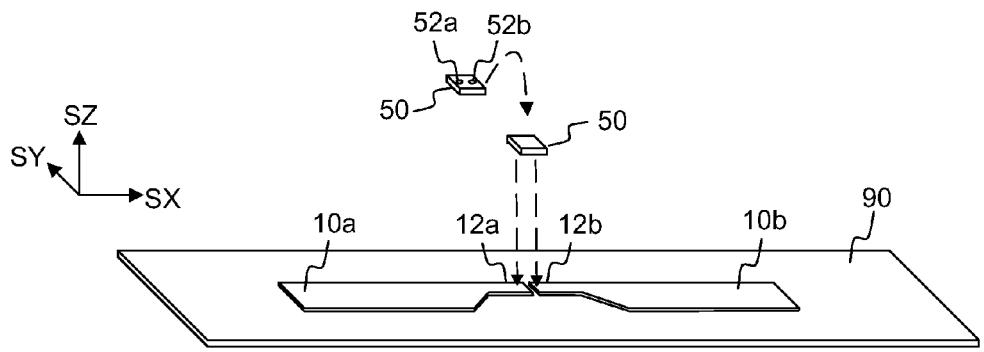
FIG. 1 shows, in a three dimensional view, a known method for producing RFID tags.
Figure 2A:
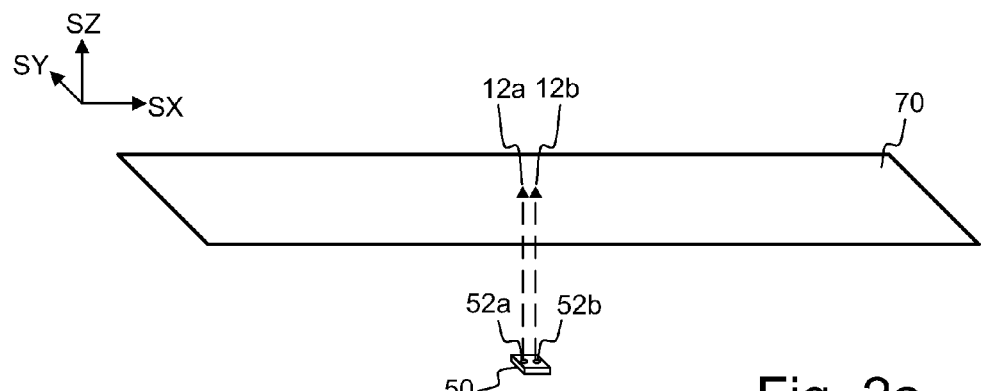
FIG. 2a shows, in a three dimensional view, attaching an RFID chip on a conductive sheet.

Referring to FIG. 2a, contact elements 52a, 52b of an RFID chip 50 may be bonded to a conductive sheet 70 even before terminal portions 12a, 12b of the antenna elements have been separated from an outer portion of the conductive sheet. The contact elements 52a, 52b, are electrically connected to the terminal portions 12a, 12b.

The conductive sheet 70 may comprise e.g. aluminum (Al), copper (Cu), nickel (Ni), tin (Sn), zinc (Zn), iron (Fe), silver (Ag), gold (Au), graphite (C), magnesium (Mg), titanium (Ti), and/or lead (Pb). Environmentally friendly low-cost materials may be preferred. In particular, the conductive sheet 70 may consist of aluminum or copper. The thickness of the conductive sheet 70 may be e.g. in the range of 0.002 mm to 0.02 mm, in the range of 0.02 mm to 0.08 mm, or in the range of 0.08 mm to 0.2 mm.

The contact elements 52a, 52b of the chip 50 may comprise e.g. copper, aluminum, tin, silver, nickel, and/or gold.

The contact elements 52a, 52b may be contact bumps. The contact elements 52a, 52b may be contact pads.

The RFID chip 50 may comprise more than two contact elements 52a, 52b. In particular, the RFID chip 50 may have four contact elements. In particular, two contact elements may be bonded to the same antenna element in order to provide more reliable electrical contact and/or in order to provide mechanically stronger connection.

The longest dimension of the chip 50 may be e.g. smaller than or equal to 5 mm, preferably smaller than 2 mm.

SX, SY, and SZ denote orthogonal directions. The conductive sheet 70 may be (substantially) in a plane defined by the directions SX and SY. The direction SZ may be substantially perpendicular to the plane of the conductive sheet.

Figure 2B:
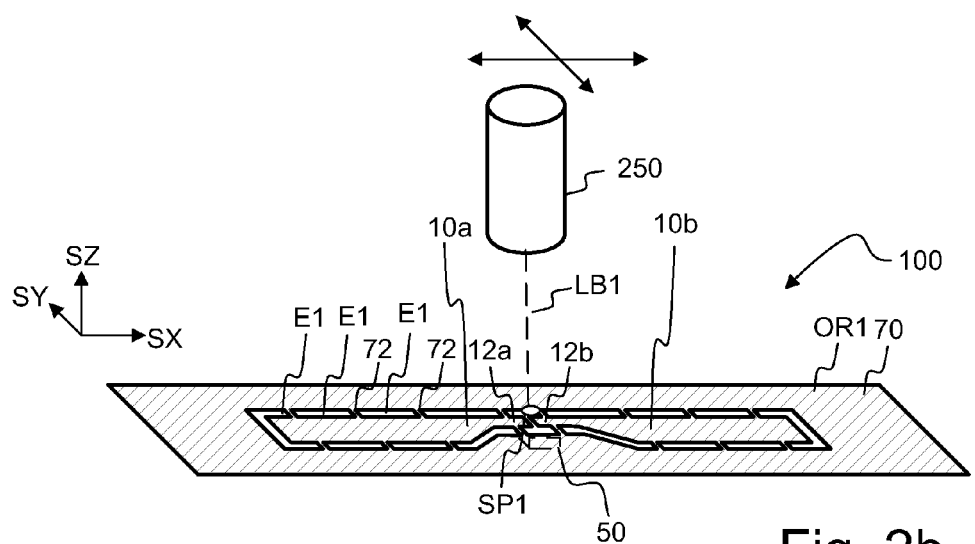
FIG. 2b shows, in a three dimensional view, cutting the shapes of antenna elements after the RFID chip has been attached to the conductive sheet.

Referring to FIG. 2b, the final shape of terminal portions 12a, 12b of the antenna elements 10a, 10b may be formed after the chip 50 has been mounted on the antenna elements 10a, 10b. In particular, the shape of the terminal portions 12a, 12b may be cut with a laser beam LB1 provided by a laser 250. A high-intensity laser spot SP1 may be moved e.g. in the directions SX and SY in order to cut the desired shape of the portions 12a, 12b.

In particular, the laser 250 may be e.g. an excimer laser, a semiconductor laser, a carbon dioxide laser or a YAG-laser.

Bonding and cutting may be made by using the same laser 250 or by using different types of lasers. For example, the electrical contact may be made by using a laser beam LB0 which effectively heats the interface between the terminal portion 12a and contact element 52a, wherein the shape of the terminal portion 12a may be cut by using a different laser beam LB0 which ablates material away from the sheet 70 with a low heating effect.

Advantageously, the laser may provide a short pulse length and high intensity in order to ablate material away from the conductive sheet 70, without excessively heating the conductive sheet 70 and/or without excessively heating the chip 50.

The material ablated away from the conductive sheet may form metal fume, which may be carried away by using a gas stream. The fume may be collected into a gas cleaning device (not shown).

In FIG. 2b, the mounted chip 50 is "under" the antenna elements 10a, 10b.

A plurality of slots E1 may be cut by using the laser beam LB1. At this stage, a plurality of links 72 may be left between the slots E1. The links 72 comprise material of the conductive sheet 70. The links 72 may temporarily support the antenna elements 10a, 10b and the chip 50. At a later stage, the antenna elements 10a, 10b may be separated from the outer portion OR1 of the conductive sheet 70 by breaking the links 72. The links may also be called as braces.

The portion OR1 does not need to completely surround the antenna elements 10a, 10b. The outer portion OR1 may also be remaining portion or an adjoining portion.

The outer portion OR1 may also be a further antenna element (not shown). Consequently, production of waste material may be minimized.

In FIGS. 2b, 3a, 4, 8a, 8b, 8d, 8e 9a, 9c, 13, 22c, 22d, 22e, 22f, 24, 25a, 25c the conductive material has been indicated by a hatch pattern. The hatch pattern of FIG. 2b, 3a, 4, 8a, 8b, 8d, 8e 9a, 9c, 13, 22c, 22d, 22e, 22f, 24, 25a, 25c does not indicate a cross section. The hatch pattern in FIG. 22a indicates a portion of the laser beam passing through a groove.

Figure 3A:
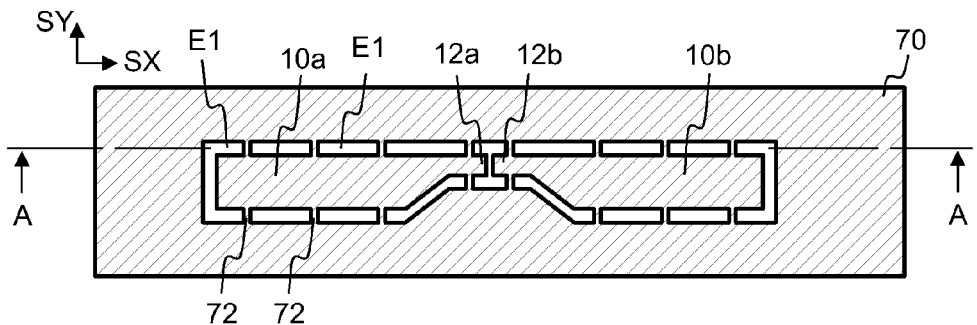
FIG. 3a shows, in a top view, antenna elements cut from a conductive sheet, wherein the antenna elements are still connected to an outer portion of the conductive sheet.

FIG. 3a shows, in a top view, the slots E1 cut by using the laser beam LB1.

Figure 3B:
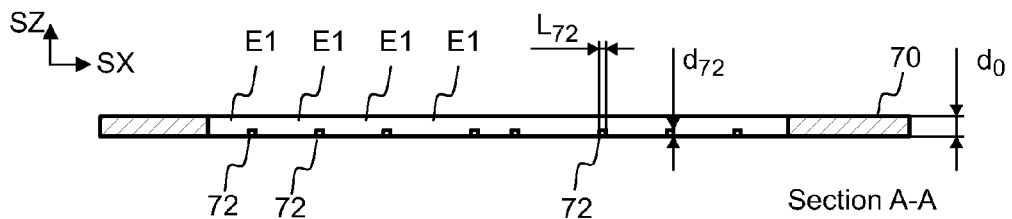
FIG. 3b shows, in a cross-sectional side view, several slots, which separate the antenna elements of FIG. 3a from an outer portion of the conductive sheet.

FIG. 3b shows, in a cross-sectional side view, the slots E1 cut by using the laser beam LB1. The cross-section relates to the line A-A shown in FIG. 3a.

The width $L_{72}$ of the links 72 and the thickness $d_{72}$ of the links 72 may be selected such that the antenna elements 10a, 10b may be easily separated from the outer portion of the conductive sheet 70. The thickness $d_{72}$ may be smaller than the thickness $d_0$ of the conductive sheet 70 in order to facilitate separation. The thickness $d_{72}$ may be controlled e.g. by adjusting intensity or of the laser beam LB1.

The thickness $d_{72}$ may also be equal to the thickness $d_0$ of the conductive sheet 70.

Figure 4:
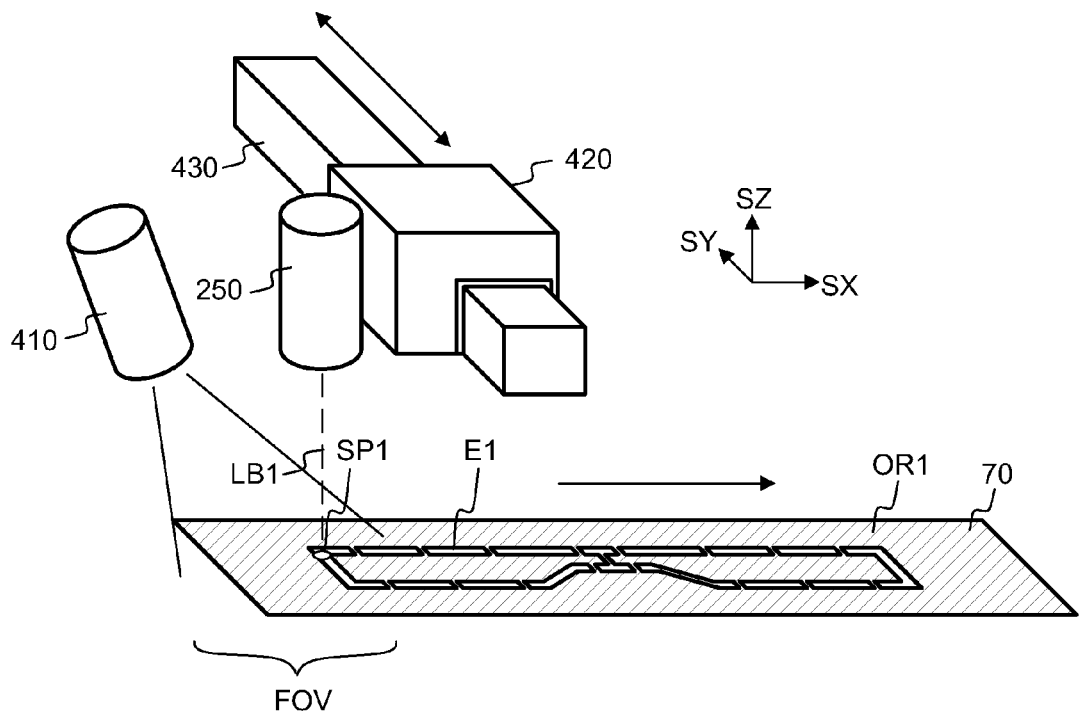
FIG. 4 shows, in a three dimensional view, a laser beam steering and monitoring system.

Referring to FIG. 4, the spot SP1 of the laser beam LB1 may be moved with respect to the conductive sheet e.g. by using a beam steering unit.

For example, the beam steering unit may comprise a translation stage. The translation stage may be a linear translation stage. A laser 250 may be attached to a linear translation unit 420, which is arranged to move along a linear guide 430 in the direction SY. The beam steering unit may also comprise another translation stage for moving the laser 250 in the direction SX. However, the second translation stage may be omitted if the conductive sheet 70 is moved in the direction SX e.g. by a pair of rollers (See FIG. 11a).

The beam steering unit may comprise e.g. one or more movable mirrors, prisms, lenses, diffractive elements and/or masks for changing the position of the laser spot SP1 on the conductive sheet 70. In other words, it is not necessary to move the laser 250.

Several laser beams may be used for cutting several slots E1 substantially simultaneously.

The conductive sheet 70 may be moved with respect to the laser beam LB1.

The apparatus may comprise a monitoring unit 410 for monitoring the laser cutting process. The monitoring unit 410 may comprise e.g. a digital camera and/or a pyrometer.

The monitoring unit 410 may be arranged to determine the position of the spot of the laser beam LB1 with respect to the conductive sheet 70. The monitoring unit 410 may be arranged to determine the position of the chip 50 attached to the conductive sheet 70. The monitoring unit 410 may be arranged to monitor the temperatures of the materials heated by the laser beam. The monitoring unit 410 may be arranged to monitor depth of slots or grooves cut on the conductive sheet 70.

Information provided by the monitoring unit 410 may be used for controlling the position, power and/or scanning speed of the laser beam LB1. Scanning speed means the relative velocity of the spot SP1 of the laser beam LB1 with respect to the conductive sheet 70.

The monitoring unit 410 may have a field of view FOV.

Figure 5A:
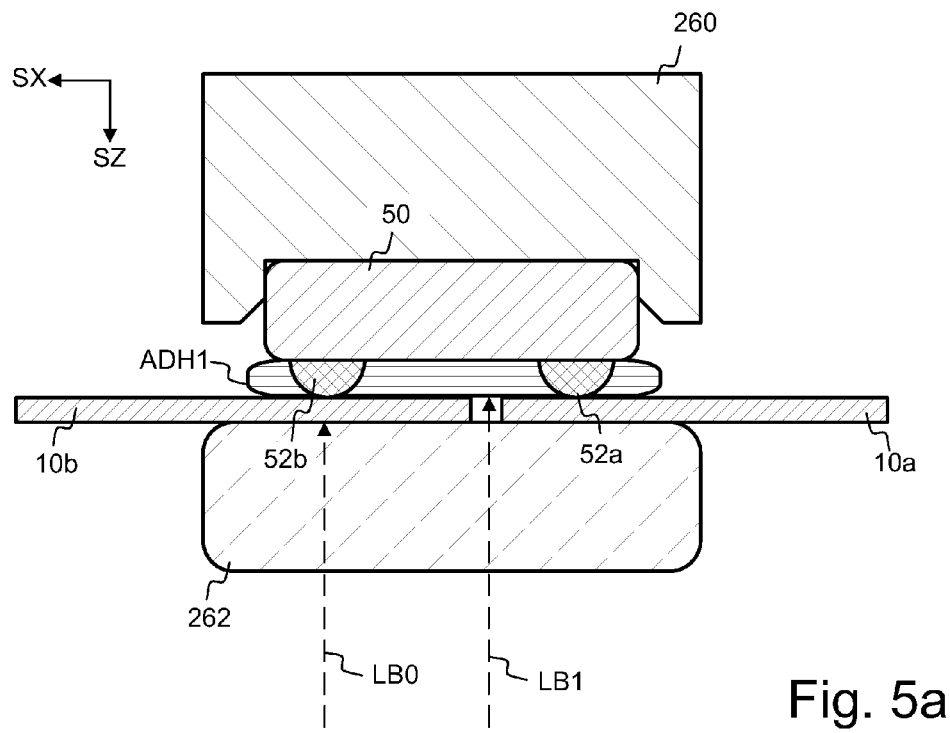
FIG. 5a shows, in a cross-sectional side view, bonding of the RFID chip to the antenna elements.

Referring to FIG. 5a, contact elements 52a, 52b of an RFID chip may be bonded to the antenna elements 10a, 10b e.g. by laser welding or by laser soldering.

Laser welding may comprise heating the surface of a contact element 52b by a laser beam LB0 to a temperature, which is higher than the melting point of the conductive sheet 70.

A contact element 52b may comprise a core coated with a solder material. The melting temperature of the solder material may be lower than the melting point of the core in order to maintain the dimensions of the contact element 52b during bonding. Laser soldering may comprise heating the surface of a contact element 52b by a laser beam LB0 to a temperature, which is higher than the melting temperature of a solder material, and lower than the melting temperature of the conductive sheet 70.

The chip 50 may be supported by a holding member 260. The antenna 10b may be pressed against the contact elements 52a, 52b of the chip 50 e.g. by a plate 262, which allows transmission of a laser beam LB0 to the antenna 10b.

The laser beam LB0 may heat the material of the antenna 10b, which in turn may cause melting of the material of the contact element 52b and/or melting of the material of the antenna 10b. Thus, a welded joint or a soldered joint may be formed between the contact element 52b and the antenna 10b.

The chip 50 may be more securely fastened to the antenna elements 10a, 10b by using adhesive ADH1 between the chip 50 and the antenna elements 10a, 10b.

The plate 262 may be e.g. a quartz plate or a sapphire plate.

The final shape of the terminal portions of the antenna elements 10a, 10b may be cut by a laser beam LB1 after the chip has been mounted on the antenna elements 10a, 10b. The shape may be cut by using a laser beam LB1. The intensity of the laser beam LB1 may be substantially higher than the intensity of the laser beam LB0.

The power/intensity of the laser beam LB1 may be controlled such that the laser beam LB1 does not substantially damage the chip 50. In particular, the laser beam LB1 may be pulsed such that it ablates material away from the conductive sheet 70, wherein the heating effect may be low. In particular, the laser beam LB1 may be produced by an excimer laser. The wavelength of the laser beam LB1 may be in the ultraviolet range.

The chip 50 may have a protective coating (not shown) in order to prevent damage caused by the laser beam. The protective coating may be a thermally insulating coating or an optically reflective coating.

The bonding and cutting apparatus may comprise a mask, which is temporarily positioned between the chip 50 and the antenna elements 10a, 10b during the cutting with the laser, in order to protect the chip 50.

The laser beams LB0, LB1 may be provided by different lasers.

The laser beam LB1 may also be provided by the same laser as the laser beam LB0 used for bonding e.g. by adjusting the power of a laser unit.

Figure 5B:
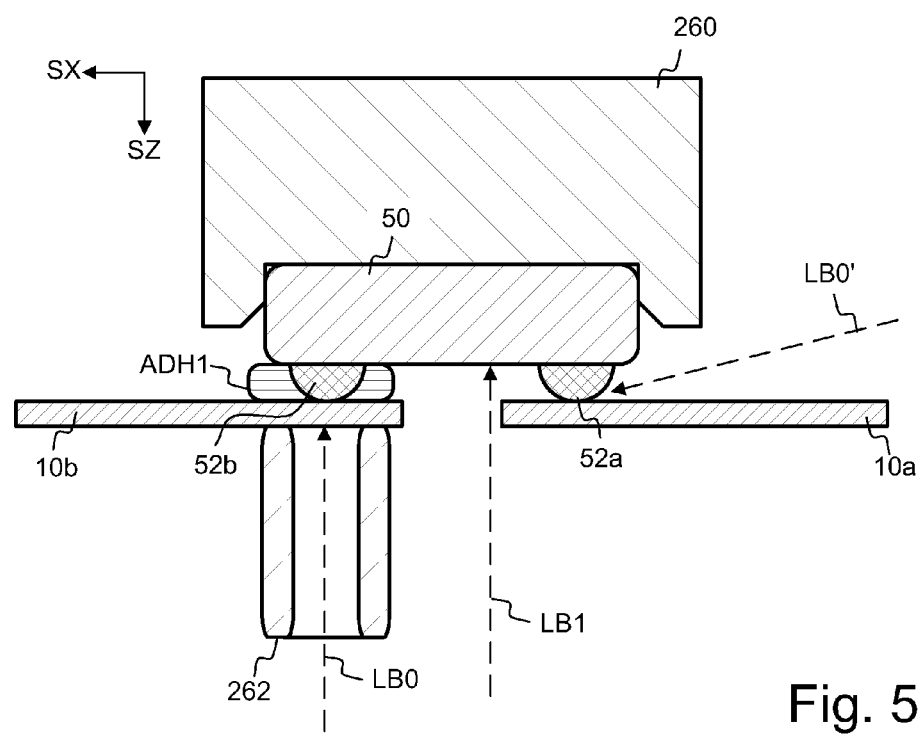
FIG. 5b shows, in a cross-sectional side view, bonding of the RFID chip to the antenna elements.

The contact surface of the compressing member 262 may become dirty, which in turn may prevent successful heating. Contamination of a transparent surface may be avoided by replacing the surface with a hole. The plate 262 may be e.g. ceramic plate, which has a hole for allowing transmission of the laser beam through the plate. Referring to FIG. 5b, the compressing force may be concentrated to the vicinity of an individual contact element 52b. The compressing member 262 may be a tubular member.

In an embodiment, the electrical contact between the contact elements 52a, 52b and the antenna elements 10a, 10b may be formed by an electrically conducting adhesive, i.e. without using laser welding or soldering. In particular, the adhesive may be an anisotropically conductive paste (ACP).

FIGS. 5a and 5b show that the laser beam LB0 may impinge on a second surface of the sheet 70 such that an interface between the sheet 70 and the contact element 52b may be heated by heat conducted through the sheet 70.

However, a laser beam LB0' may also directly impinge on the contact element 52b and/or on the first surface of the sheet 70 facing the chip 50.

Figure 6:
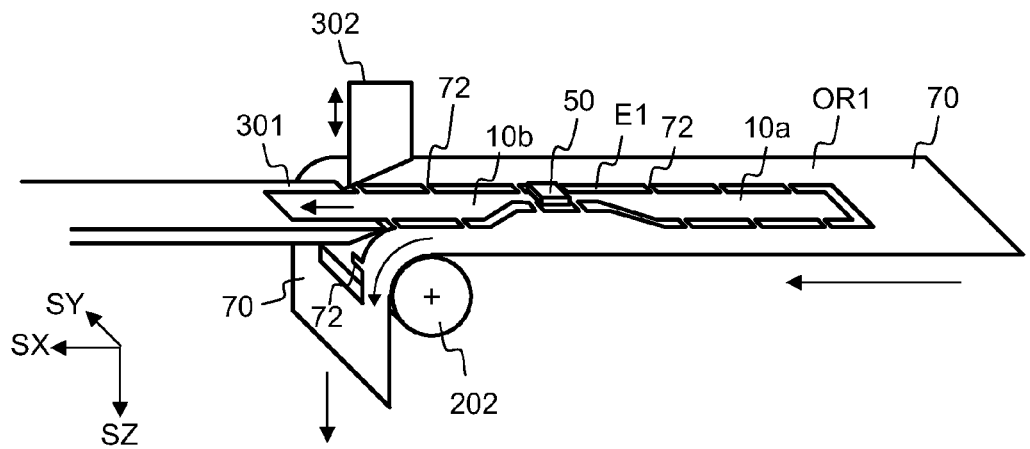
FIG. 6 shows, in a three dimensional view, a method for separating antenna elements from the outer portion of the conductive sheet.

FIG. 6 shows a method for separating the antenna elements 10a, 10b from the outer portion of the conductive sheet 70. After cutting with the laser, the elements 10a, 10b may be attached to the outer portion by the links 72. The links 72 may be broken in order to separate the elements from the outer portion. The elements 10a, 10b may be pulled or pushed away from the outer portion in order to break the links 72.

A portion of the sheet 70 may be bent by tensioning the sheet 70 around a bending member 202. The bending member may be e.g. by a roll 202. Consequently, an end portion of the element 10b may protrude with respect to the bent portion of the sheet 70. A separating member 301 may be arranged to push the protruding antenna element 10b away from the outer portion of the sheet 70 when the bent sheet 70 is moved with respect to the bending member 202. The separating member 301 may be a wedge.

The position of the links 72 may be selected such that the end of the antenna element 10b may protrude with respect to the outer portion of the sheet 70 when the sheet 70 is bent.

The dimensions of the links 72 or bridge elements 72 may be selected such that the antenna elements may be separated from the outer portion OR1 by just by pulling or pushing the antenna elements, i.e. the use of cutting blades 302 is not necessary.

Figure 8A:
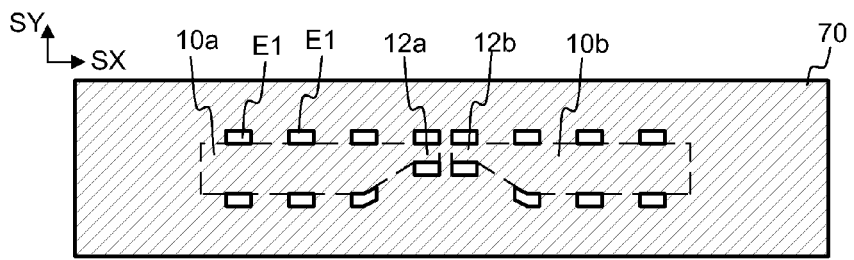
FIG. 8a shows, in a top view, producing a first group of slots
Figure 8B:
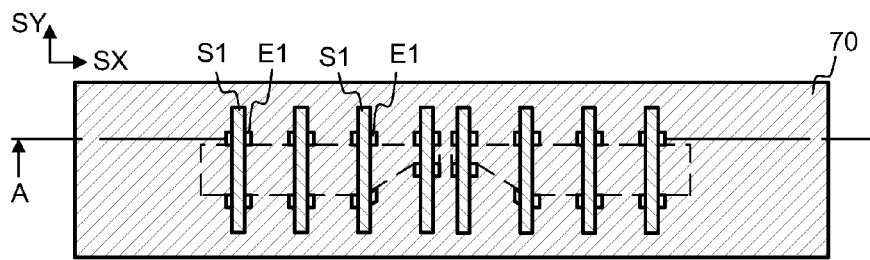
FIG. 8b shows, in a top view, forming supporting bridges, which coincide with the slots of the first group.
Figure 8C:
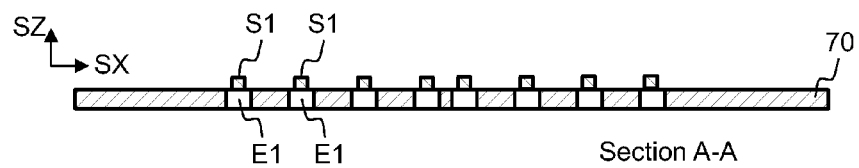
FIG. 8c shows, in a cross-sectional side view, the bridges of FIG. 8c.

However if desired, the apparatus may further comprise one or more cutting edges 302 for cutting the links 72 or bridge elements S1 (FIG. 8b, 8c). The cutting edges may be movable or stationary. The roller 202 may comprise one or more cutting edges.

Figure 7A:
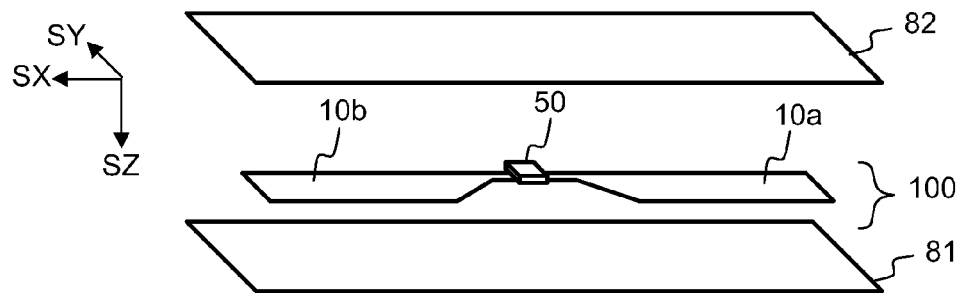
FIG. 7a shows, in a three dimensional view, laminating an RFID transponder between two sheets.

Referring to FIG. 7a, the RFID transponder 100 separated from the outer portion OR1 may be laminated to a carrier sheet 81 in order to provide an RFID tag 110 or an RFID inlay 110. The RFID transponder 100 comprises the chip 50 and one or more antenna elements 10a, 10b. The carrier sheet 81 may comprise e.g. plastic, paper or cardboard. The carrier sheet 81 should be electrically insulating.

In particular, The RFID transponder 100 may be laminated between a first protective sheet 81 and a second protective sheet 82. The sheets 81, 82 may be e.g. plastic, paper or cardboard. The thickness of the sheet 81 may be e.g. in the range of 0.03 to 1 mm.

Figure 7B:
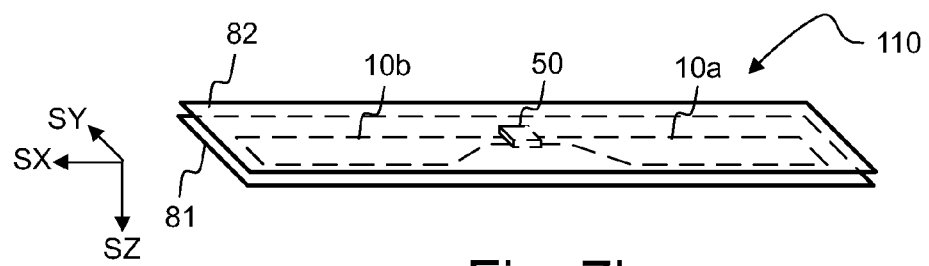
FIG. 7b shows, in a three dimensional view, a laminated RFID transponder.

FIG. 7b shows an RDID tag 110 comprising an RFID transponder 100 laminated between two or more sheets 81, 82.

Figure 16:
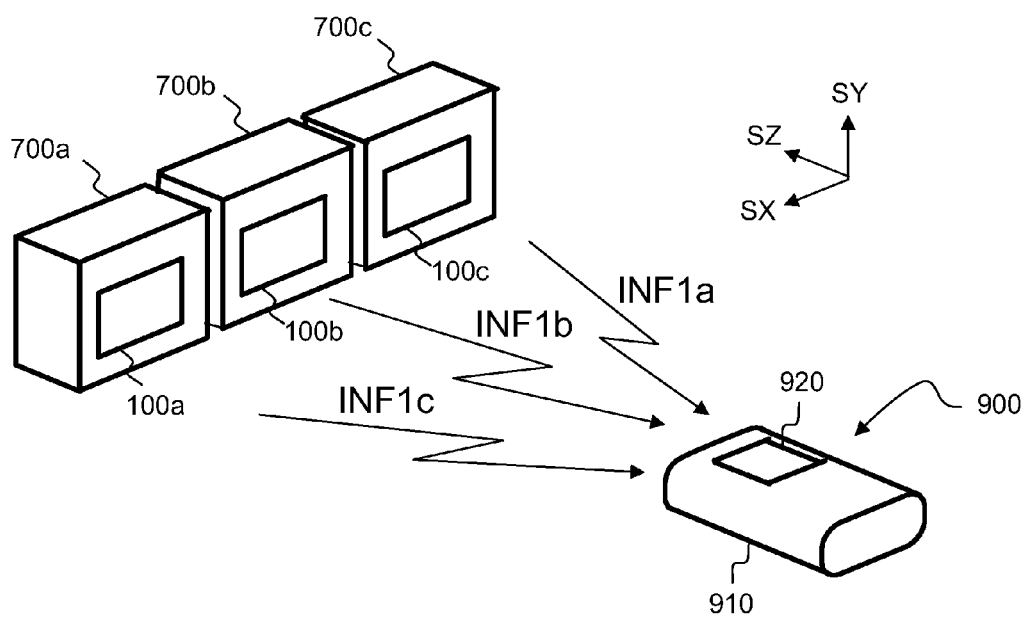
FIG. 16 shows RFID transponders attached to items.

Alternatively, the RFID transponder 100 may be directly attached to an item 700a (See FIG. 16). The item 700a may be e.g. a cardboard box or a battery for an electronic device. The RFID transponder 100 may be attached to a surface of the item 700a or the RFID transponder 100 may be embedded in the item 700a.

FIGS. 8a-8f show forming antenna elements 10a, 10b, by using supporting bridges S1. The purpose of the bridges S1 is to temporarily support or "rigidize" the antenna elements 10a, 10b after a substantially continuous gap E0 surrounding the antenna elements 10a, 10b has been formed. Without the bridges S1, the antenna elements 10a, 10b might move in an uncontrollable way and/or they might become wrinkled when they are separated from the remaining portion OR1 of the sheet 70.

FIG. 8a shows a first step, where a first group of slots E1 is formed in the conductive sheet 70.

FIG. 8b shows a second step, where a plurality of supporting bridges are formed on the conductive sheet 70 such that the locations of the bridges S1 substantially coincide with the locations of the slots E1.

The material of the bridges S1 may be substantially electrically insulating. In other words, the bridges S1 may consist of dielectric material. In that case, some bridges S1 connecting different parts of an antenna element 10a, 10b, CA1 may remain even in a final RFID inlay.

The bridges S1 may be made e.g. from polyurethane lacquer, hot melt adhesive, or a lacquer curable by ultraviolet (UV) light. The material of the bridges S1 may be dispensed on the conductive sheet 70 e.g. by one or more nozzles (not shown). Hardening of a lacquer may be accelerated also by heating or by using a hardening agent.

A part of the material of the bridges S1 may also penetrate into the slot E1.

FIG. 8c shows, in a cross-sectional side view, the bridges S1 of FIG. 8b. FIG. 8c is a cross-section along the line A-A of FIG. 8b.

In a third step, a second group of slots E2 may be formed by the laser such that the slots E2 adjoin the slots E1 of the first group. The marking E2' in FIG. 8d denotes an area where the a slot E2 will be produced. The locations of the bridges S1 do not coincide with the locations of the areas E2'. Thus, the bridges S1 do not prevent cutting with the laser. Preferably, the slots E2 are through holes, i.e. they are not blocked by any substrate.

Figure 8D:
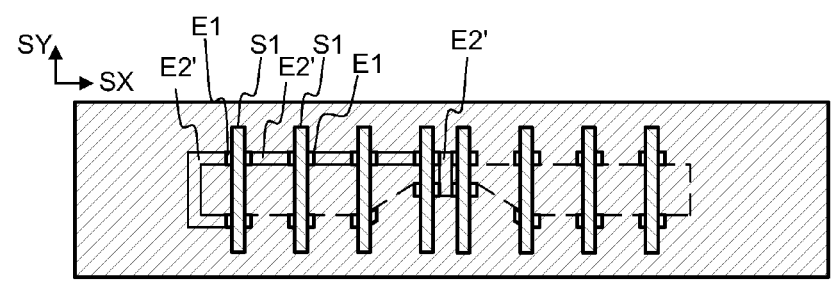
FIG. 8d shows, in a top view, producing a second group of slots such together substantially separate the antenna elements from the outer portion of the conductive sheet.
Figure 8E:
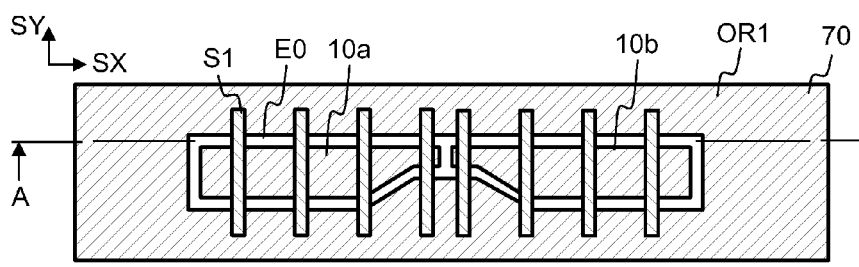
FIG. 8e shows, in a top view, a substantially continuous slot surrounding the antenna elements.

Referring to FIG. 8e, a substantially continuous slot E0 may be formed by joining the slots E1 of the first group by the slots E2 of the second group such that the slot E0 substantially surrounds the antenna elements 10a, 10b.

Thus, the continuous slot E0 may be formed as a combination of the slots E1 and E2.

Figure 8F:
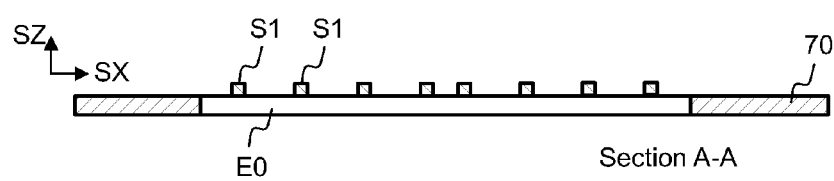
FIG. 8f shows, in a cross-sectional side view, the slot of FIG. 8e.

FIG. 8f shows, in a cross-sectional side view, the substantially continuous slot E0. FIG. 8f is a cross-section along the line A-A shown in FIG. 8e.

Thus, a method of producing a RFID transponder 100 comprising an antenna element 10a may comprise in the following order:
attaching an RFID chip 50 onto a conductive sheet 70,
cutting a first slot E1,
providing a supporting bridge S1 such that the location of the bridge S1 substantially coincides with the location of the first slot E1, and
cutting a second slot E2 adjoining the first slot E1.

The antenna element 10a may be subsequently separated from a remaining portion of the conductive sheet by cutting the bridges S1. The separated RFID transponder 100 may be laminated between (flexible) substrates so as to form an RFID inlay (FIGS. 7a, 7b). The separated RFID transponder 100 may be directly attached to a product 700a (FIG. 16) in order to minimize process steps and/or in order to minimize the use of substrates.

FIGS. 9a-9d show the use of a support web MSH1 instead of individual supporting bridges S1. The support web MSH1 comprises a plurality supporting bridges S1 interconnected to each other.

Figure 9A:
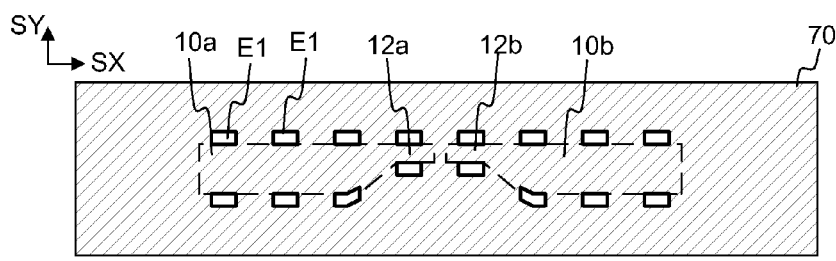
FIG. 9a shows, in a top view, producing a first group of slots.

Referring to FIG. 9a, a first group of slots E1 may be formed as in case of FIG. 8a.

Figure 9B:
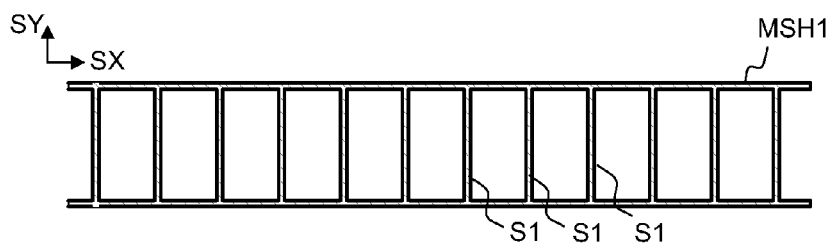
FIG. 9b shows, in a top view, a supporting mesh structure.

FIG. 9b shows a support web MSH1, which consists of electrically insulating, i.e. dielectric material. In this case, the support web MSH1 has the form of a ladder. Other possible forms are shown e.g. in FIGS. 10a-10c. The support web MSH1 may be produced e.g. by die-cutting a plastic sheet.

Figure 9C:
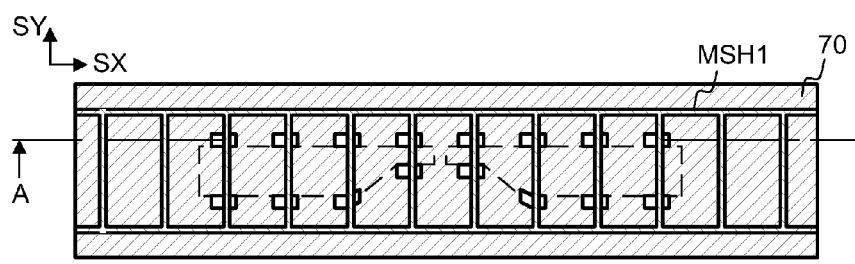
FIG. 9c shows, in a top view, the mesh structure of FIG. 9b laminated over the conductive sheet such that bridge elements of the mesh structure coincide with slots of the first group.

FIG. 9c shows how the support web MSH1 may be laminated on the conductive sheet 70 e.g. by using an adhesive. Elements of the support web MSH1 should coincide with the slots E1 of the first group.

Figure 9D:
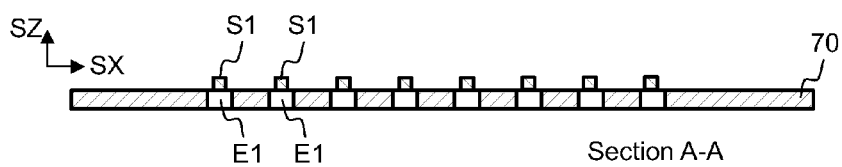
FIG. 9d shows, in a cross-sectional side view, the mesh structure of FIG. 9c.

FIG. 9d shows in a cross-sectional side view, the support web MSH1 laminated on the conductive sheet 70. FIG. 9d is a cross-sectional side view along the line A-A of FIG. 9c.

In a subsequent step, a substantially continuous slot E0 may be formed as was shown in FIGS. 8d-8f. In other words, the slots E1 of the first group may be joined by slots E2 of a second group.

Figure 10A:
FIG. 10a shows, in a top view, a supporting structure.

FIG. 10a shows a support web MSH1 having a zig-zag pattern. This kind of a prefabricated support web MSH1 may be laminated on the conductive sheet 70. Alternatively, this kind of a support web MSH1 may be produced on the conductive sheet 70 by a dispensing nozzle, which makes transverse movements over a longitudinally moving conductive sheet. The dispensing nozzle may feed e.g. an adhesive paste, e.g. a hot melt adhesive or a polyurethane adhesive.

Figure 10B:
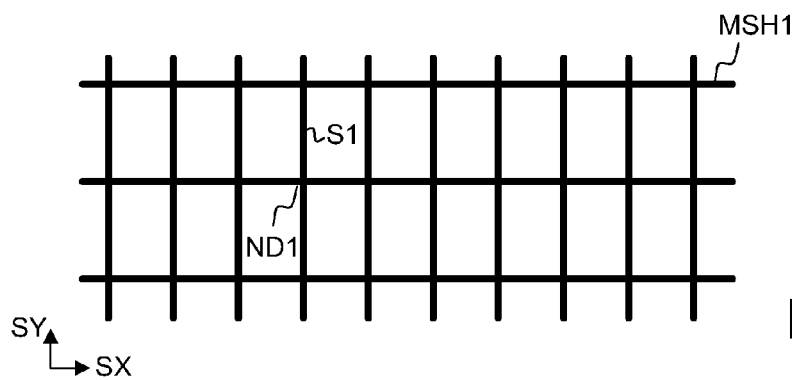
FIG. 10b shows, in a top view, a supporting rectangular mesh structure.

FIG. 10b shows a support web MSH1, which is a substantially rectangular mesh.

Figure 10C:
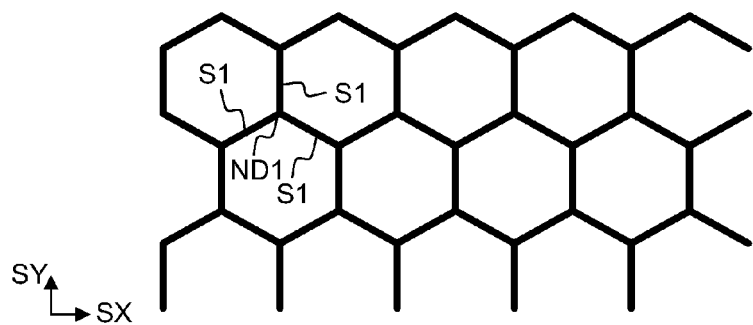
FIG. 10c shows, in a top view, a supporting hexagonal mesh structure.

FIG. 10c shows a support web MDH1, which is a substantially hexagonal mesh. The hexagonal mesh may provide greater dimensional stability than rectangular mesh. An internal node ND1 of the hexagonal mesh may occupy less space than a node of a rectangular mesh because the internal node ND1 of a hexagonal mesh is directly connected to only three bridges S1, whereas an internal node a rectangular mesh is directly connected to four bridges S1.

Lamination of a pre-fabricated web MSH1 may allow a higher production speed than forming individual bridges S1 on the conductive sheet 70.

The pre-fabricated web MSH1 should be positioned with respect to the conductive sheet such that it is in register with the slots E1. The monitoring unit 410 and or a further monitoring unit (not shown) may be arranged to synchronize the feeding of the web MSH1 with the slots E1.

Figure 11A:
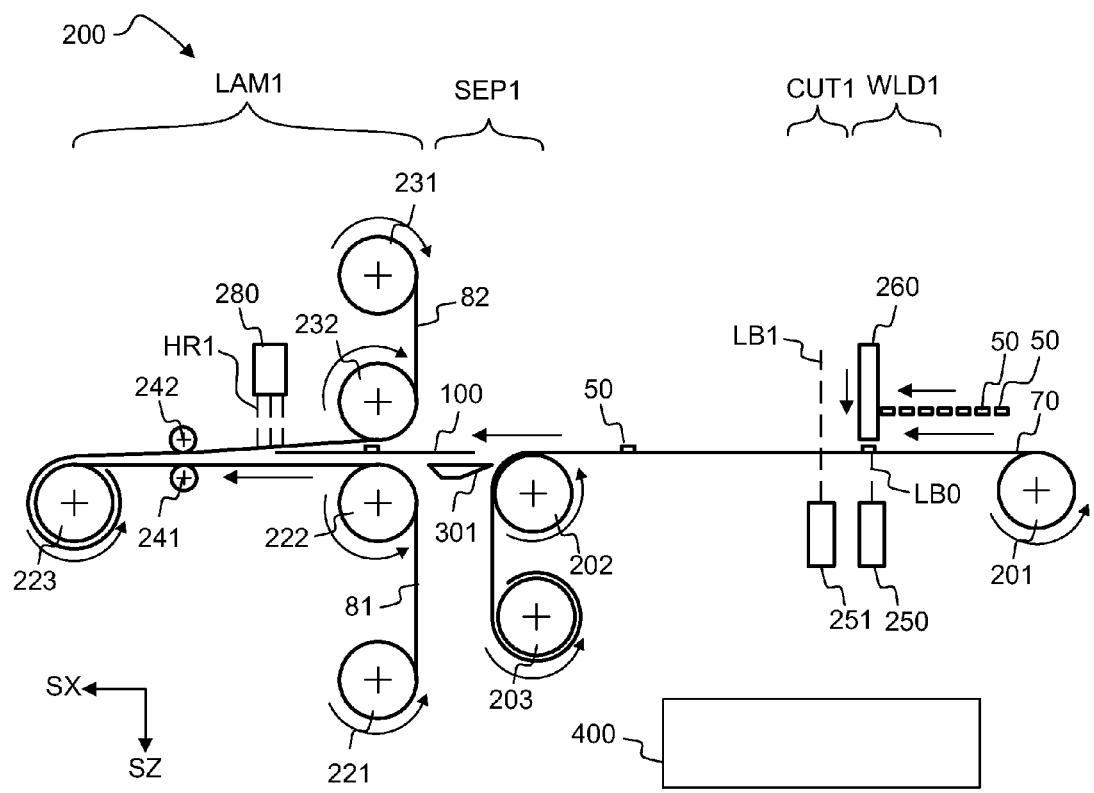
FIG. 11a shows, in a side view, an apparatus for producing RFID tags, wherein the apparatus is arranged to produce links, which connect the antenna and the outer portion of the conductive sheet.

FIG. 11a shows an apparatus 200 for producing laminated RFID tags. A conductive sheet 70 may be moved by rolls 201, 202, 203. Chips 50 may be dispensed onto the sheet 70 by a holder 260. The chips 50 may be bonded to the sheet by a laser 250. The antenna elements 10a, 10b may be cut by the laser 251. The formed transponders 100 may be separated from the outer portion of the sheet 70 by bending the sheet around the roll 202 and by pushing the antenna elements by the separating member 301.

A first sheet 81 may be moved by rolls 221, 222, 223. A second sheet 82 may be moved by rolls 231, 232, 223. The sheets 81, 82 may be moved substantially at the same speed as the conductive sheet 70.

The rolls 222, 232 may form a nip, which grabs the end of the antenna element, and which pulls the RFID transponder such that it can be laminated between the sheets 81, 82. The lamination may be assisted by using pressure rolls 241, 242. If needed, heat for the lamination may be provided by a heating unit 280.

The laminated RFID transponders 100 may be collected around the roll 223. The laminated RFID transponders 100 may be delivered as sheets wound in reel. The sheet may comprise a one-dimensional or a two-dimensional array of RFID transponders 100. Individual RFID transponders 100 or RFID tags 110 may be separated from the sheet at a later stage e.g. by die-cutting or along perforations.

WLD1 denotes a zone where the chip 50 is bonded to the conductive sheet 70. CUT1 denotes a zone where the shape of the antenna elements 10a, 10b may be cut. SEP1 denotes a zone where the RFID transponders 100 are separated from the outer portion of the conductive sheet 70. LAM1 denotes a zone where the RFID transponders 100 are laminated between protective sheets 81, 82.

The operation of the apparatus 200 may be controlled by a control unit 400. The control unit 400 may be configured to control e.g. the velocities of the sheets 70, 81, 82, movements of the laser beams, and laser power.

Figure 11B:
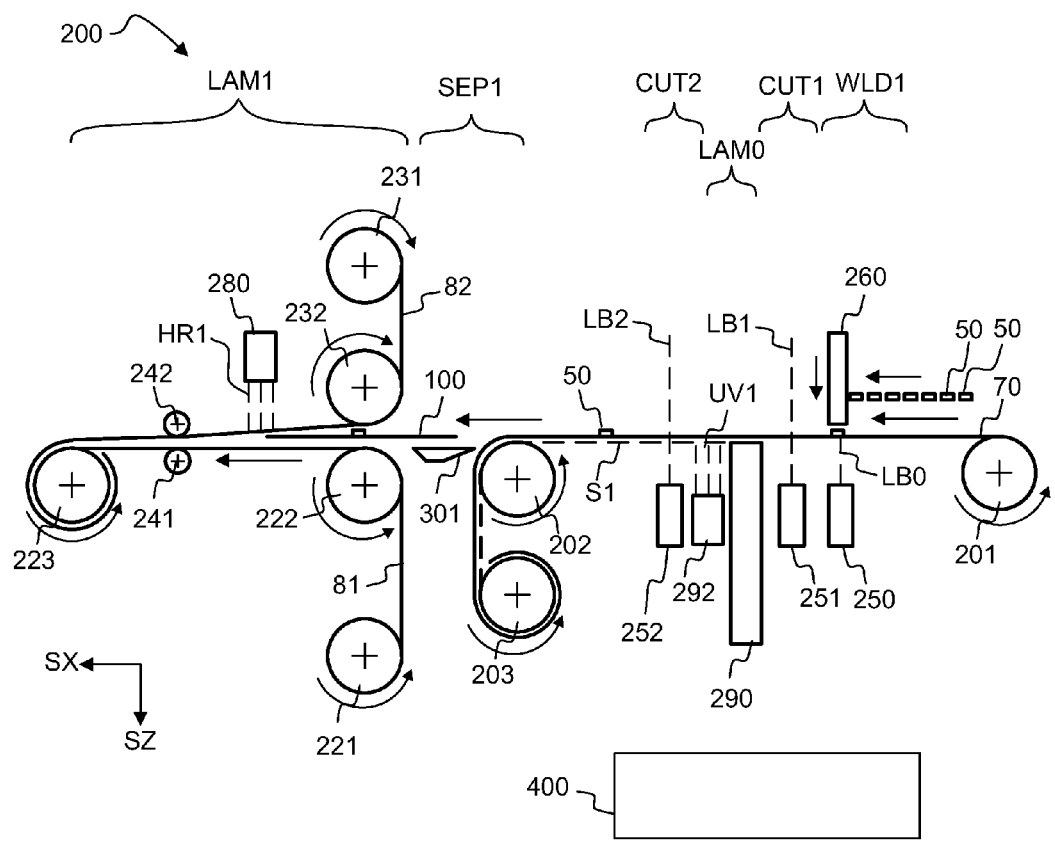
FIG. 11b shows, in a side view, an apparatus for producing RFID tags, wherein the apparatus comprises a bridging unit.

FIG. 11b shows an apparatus 200 for producing laminated RFID tags. The apparatus of FIG. 11b comprises a dispensing unit 290 for producing supporting bridges S1 onto the conductive sheet 70, as shown e.g. in FIGS. 8a-8f. The apparatus 200 may comprise a radiation source 292. The radiation source may provide e.g. ultraviolet light UV1 for curing material of the bridges S1.

The apparatus 200 may comprise a laser 252 for producing a third laser beam LB2, in order to cut the slots E2 of the second group.

LAM0 denotes a zone where the bridges S1 or a web MSH1 is supplied. CUT2 denotes a zone where the second slots E2 are formed.

Figure 11C:
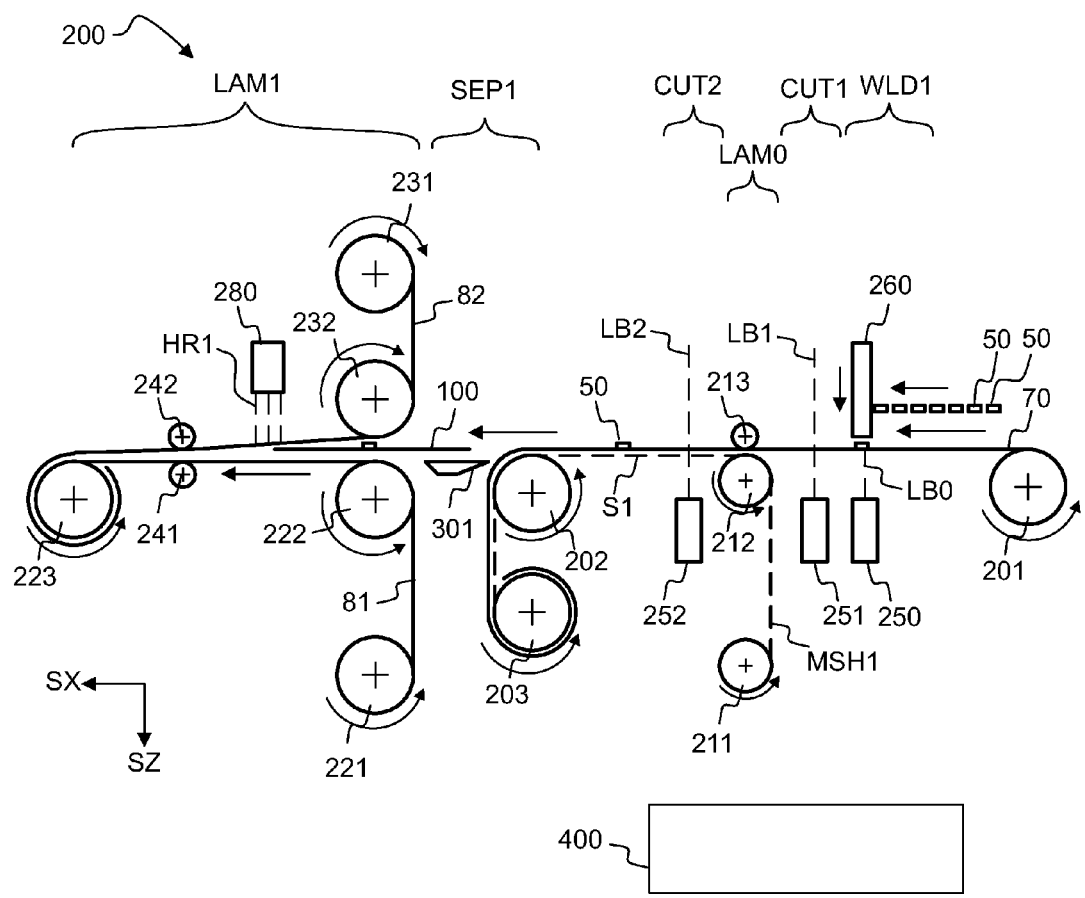
FIG. 11c shows, in a side view, an apparatus for producing RFID tags, wherein the apparatus comprises a mesh laminating unit.

FIG. 11c shows an apparatus 200 for producing laminated RFID tags. The apparatus of FIG. 11b comprises rolls 211, 212, 213 for laminating a support web MSH1 onto the conductive sheet 70.

Figure 12A:
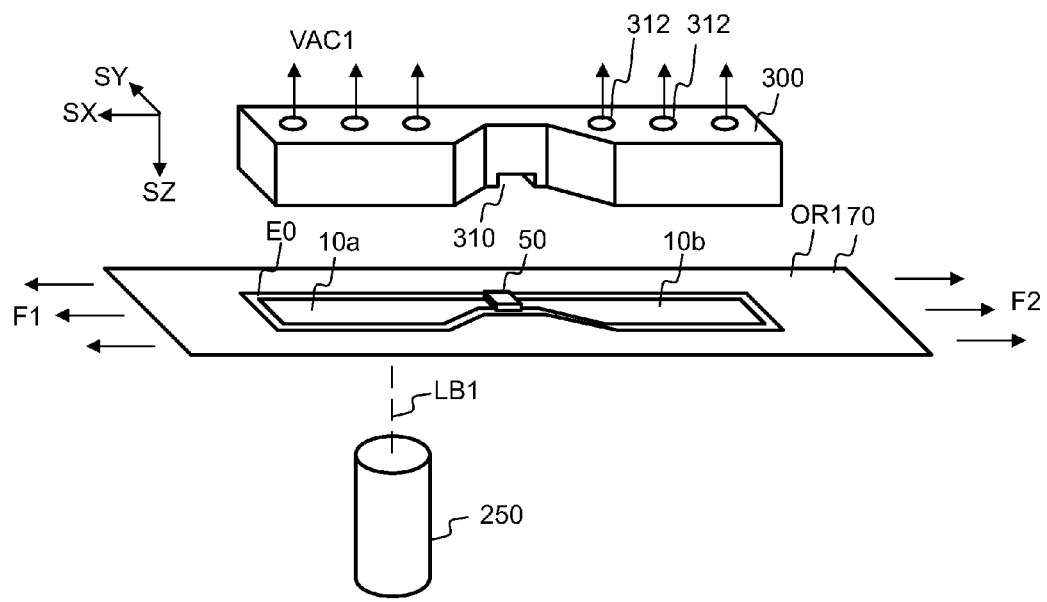
FIG. 12a shows, in a three dimensional view, a holding member for supporting the antenna and moving the antenna away from the vicinity of the outer portion of conductive sheet.
Figure 12B:
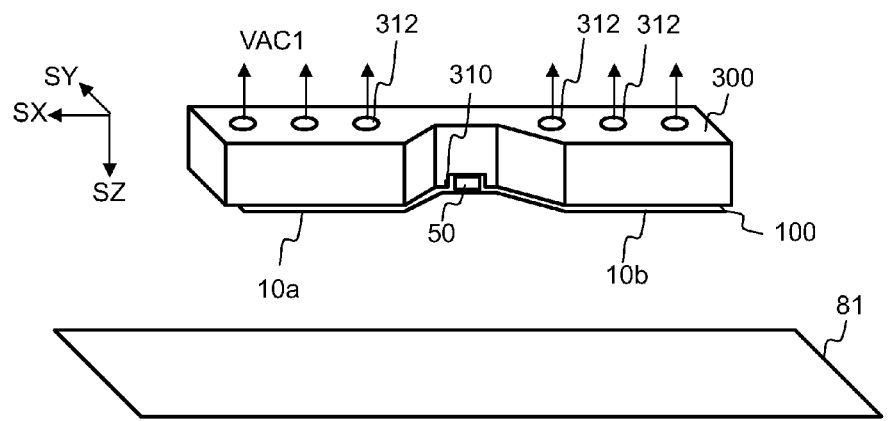
FIG. 12b shows, in a three dimensional view, antenna elements attached to the holding member of FIG. 12a, FIG. 13a shows a coil antenna element supported by a mesh.

Referring to FIG. 12a, the antenna elements 10a, 10b and the chip 50 may be supported by a holding member 300. The holding member 300 may comprise e.g. holes 312, which are connected to a low-pressure unit (not shown). The gas pressure difference VAC1 ("vacuum") created by the holes 312 may fasten the antenna elements 10a, 10b firmly against the surface of the holding member 300. The low pressure unit may be a pump. In particular, the low pressure unit may comprise a suction pump and a vacuum tank to provide a substantially constant low pressure, and one or more valves for switching the low pressure (vacuum) in the holes 312 on and off.

Thus, the antenna elements may be held securely in position when the (final) shape of the antenna elements 10a, 10b is cut by using the laser beam LB1 provided by the laser 250.

A substantially continuous gap or slot E0 may be cut around the combination of the antenna elements 10a, 10b and the chip (i.e. around the RFID transponder 100).

The outer portion of the conductive sheet 70 may be supported e.g. by tensioning forces F1, F2. In particular, the conductive sheet 70 may be pulled against a slightly curved surface (not shown) in order to hold the outer portion of the conductive sheet 70 securely in place.

Also the outer portion of the conductive sheet 70 may be fastened to a holding surface (not shown) by a low pressure.

The RFID transponder 100 may now be lifted (moved) away from the outer portion of the conductive sheet 70 by using the holding member 300, and the transponder 100 may be subsequently positioned on a carrier sheet 81. The RFID transponder 100 may be laminated onto the sheet 81 e.g. by an adhesive.

If desired, the transponder 100 may be laminated between two sheets 81, 82.

The holding member 300 may comprise a slot 310 or surface for holding the chip 50 securely in place. Thus, the holding member 300 may perform the function of the member 260.

Removal of the transponder 100 from the holding member 300 may be assisted by springs and/or by temporarily blowing gas through the holes 312 towards the transponder 100.

The holding member 300 may also have a curved holding surface. In particular, the holding member 300 may be a roll, which comprises a plurality of holes 312 connected to a low-pressure unit. The sheet 70 may be held against the surface of the roll by a pressure difference. The roll may be called e.g. as a "vacuum roll" or a "suction roll". In particular, the roll-shaped holding member 300 may be used in roll-to-roll processing.

Figure 13A:
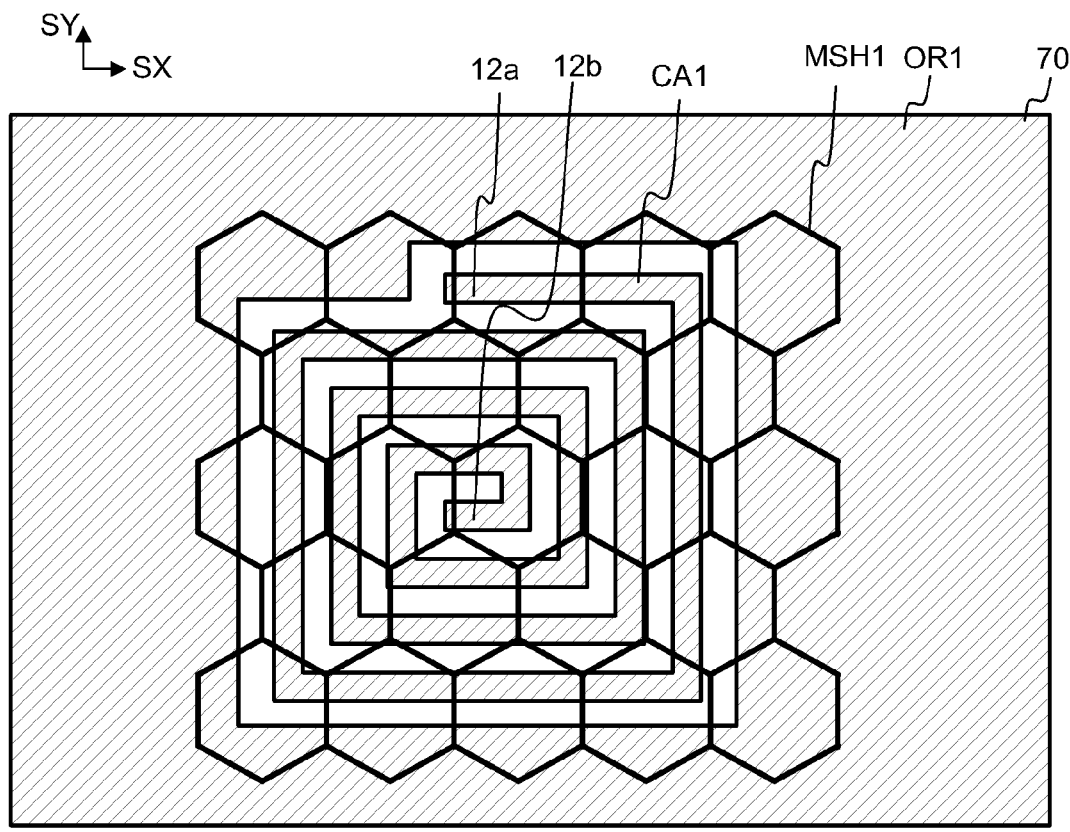
FIG. 13b shows an inductive RFID transponder, wherein turns of the inductive antenna pass between two terminal portions of the inductive antenna.

Referring to FIG. 13a, an antenna element may also be an inductive antenna. In particular, the antenna element may be a coil antenna CA1. The antenna element may be supported by a support web MSH1. The final form of a terminal portion 12a, 12b may be cut after the terminal portion 12a, 12b has been bonded to a chip 50. The other terminal portion may be bonded e.g. to an external jump wire (See FIG. 17b).

Figure 13B:
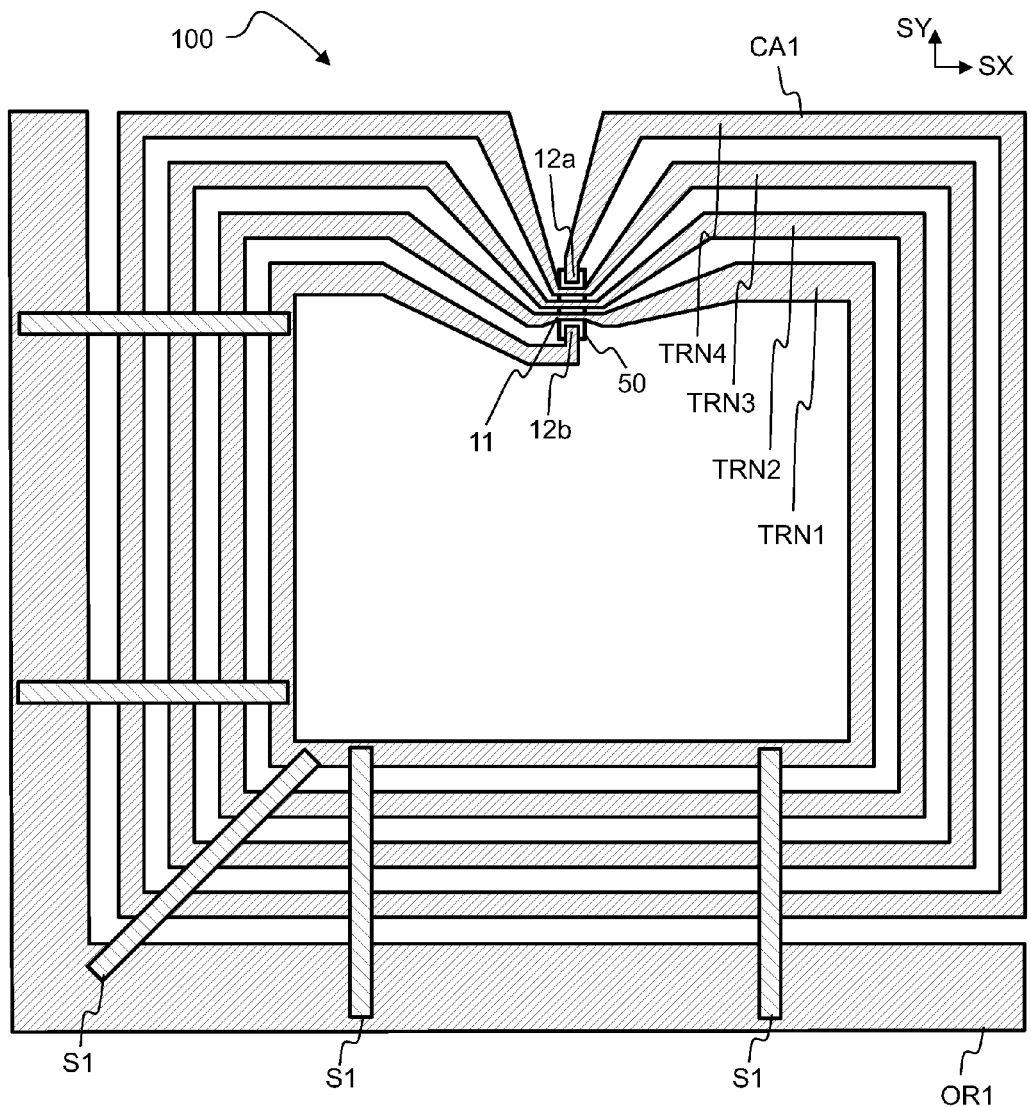

Referring to FIG. 13b, turns of a coil antenna element CA1 may be arranged to pass through a space between the contact portions 12a, 12b (i.e. through a space between the contact elements 52a, 52b. Thus, the chip 50 may comprise an internal jump wire JMP1, i.e. an external jump wire is not needed (see FIG. 17b). In this case, the coil antenna element CA1 may comprise two or more turns. The number of turns may be e.g. in the range of 3 to 20. If the coil has only one turn, there is no need to use an external or internal jump wire.

The coil CA1 shown in FIG. 13b has four turns TRN1, TRN2, TRN3, TRN4. The first turn TRN1, the second turn TRN2, and the third turn TRN3 pass through a space between the contact portions 12a, 12b. The first turn TRN1 starts at the terminal portion 12b. The fourth turn TRN4 ends at the terminal portion 12a.

In particular, narrow portions 11 of the conductive sheet 70 between the contact portions 12a, 12b may be precisely cut by using the laser beam LB1, when the chip 50 is attached to the conductive sheet 70 prior to cutting the portions 11 (see e.g. FIG. 5a). Very delicate portions 11 may be cut when the portions 11 are attached to the chip 50 by an adhesive prior to cutting.

A method for producing an RFID transponder may comprise:
attaching an RFID chip 50 onto a conductive sheet 70, and
cutting a portion 11 of an inductive antenna element CA1 from the conductive sheet 70 after the attaching such that the portion 11 passes through a space between a first terminal portion 12a and a second terminal portion 12b of the antenna element CA1.

The turns TRN1, TRN2, TRN3, TRN4 of the transponder 100 may be connected to each other and/or to a remaining portion OR1 of the sheet 70 by bridge elements S1. The transponder 100 may be separated from the remaining portion OR1 by breaking the bridge elements S1. Dielectric bridge elements S1 adhered to the turns TRN1, TRN2, TRN3, TRN4 may remain in an RFID inlay 110, i.e. it is not necessary to remove the elements S1 before lamination. The bridge elements S1 may comprise an adhesive, in particular a hot-melt adhesive, which may be subsequently used as the adhesive also when attaching the transponder 100 to a substrate 81 (FIG. 7a) or to an item 700a (FIG. 16). The bridge elements S1 may be on the same surface of the sheet 70 as the chip 50, and/or on the opposite surface.

An antenna element 10a, 10b, CA1 may be produced by a hybrid method, where the antenna element is pre-fabricated e.g. by etching, die-cutting, or water jet cutting. The final dimensions of the antenna element may be cut by using a laser beam after the chip 50 has been attached to the antenna element.

Figure 14A:
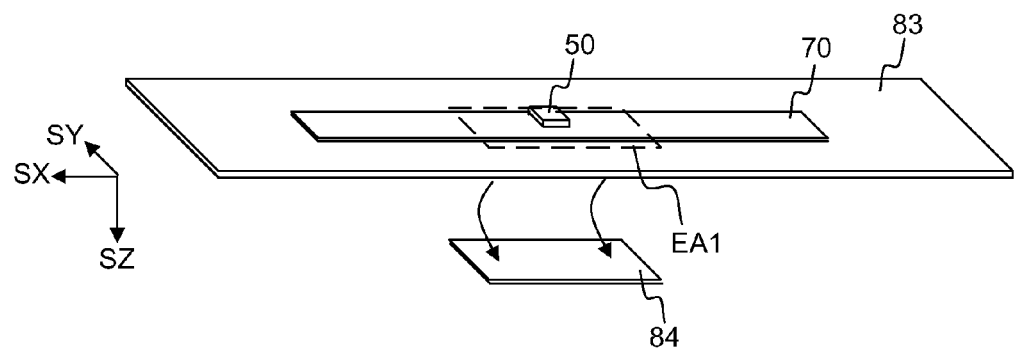
FIG. 14a shows a pre-fabricated antenna structure supported on a carrier sheet.
Figure 14B:
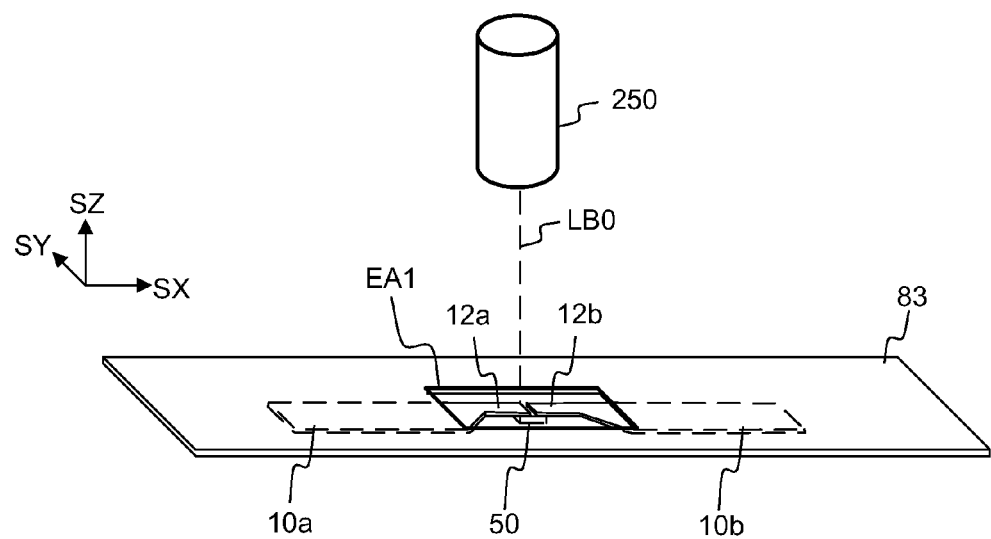
FIG. 14b shows cutting the antenna structure of FIG. 14a, FIG. 15 shows functional units of an RFID transponder.

FIGS. 14a and 14b show, by way of example, the use of pre-fabricated antenna elements 10a, 10b.

Referring to FIG. 14a, a piece of conductive sheet 70 may be attached to a support web 83. The piece of conductive sheet 70 may be provided e.g. by die-cutting or etching. The support web 83 may have a hole EA1 ("empty area") under the terminal portions of the antenna elements 10a, 10b. The hole EA1 may be provided e.g. by removing a piece 84 from the support web 83.

The contact elements of the chip 50 may be subsequently bonded to the piece of conductive sheet 70 e.g. by using laser welding, soldering or anisotropically conductive adhesive (See FIGS. 5a, 5b).

After the chip 50 has been mounted, the final shape of the terminal portions 12a, 12b may be cut via the hole EA1.

The manufacturing apparatus 200 may comprise an RF performance monitor (radio frequency performance monitor) for monitoring RF performance of the RFID transponders. If deviation from ideal performance is detected, the control unit 400 may be configured to adjust process parameters such that optimum performance may be attained.

The control (i.e. RF tuning) may be carried out on-line. The cutting of the terminal portions 12a, 12b may be controlled based on feedback. Feedback for controlling processing a present transponder may be obtained by measuring a property of a previously processed transponder and/or by measuring a property of the present transponder. In other words, a dimension of an antenna element a first RFID transponders may be changed (by laser cutting) based on information obtained from the first RFID transponder. A dimension of an antenna element a second RFID transponders may be changed (by laser cutting) based on information obtained from the first RFID transponder.

The methods described above may be applicable also in cases where the chip 50 is mounted on the antenna elements after the final dimensions of the antenna elements has been cut. However, in that case, the positioning of the chip with respect to the antenna elements may need to be accurate.

An individual contact element 52a, 52b may comprise one or more spikes (not shown). The spikes may be arranged to penetrate through the conductive sheet when the electrical contact is made. This may allow direct heating of the spikes of the contact elements by using a laser beam which impinges on a second side of the contact sheet 70, wherein the first side of the sheet is facing the chip 50.

Figure 15:
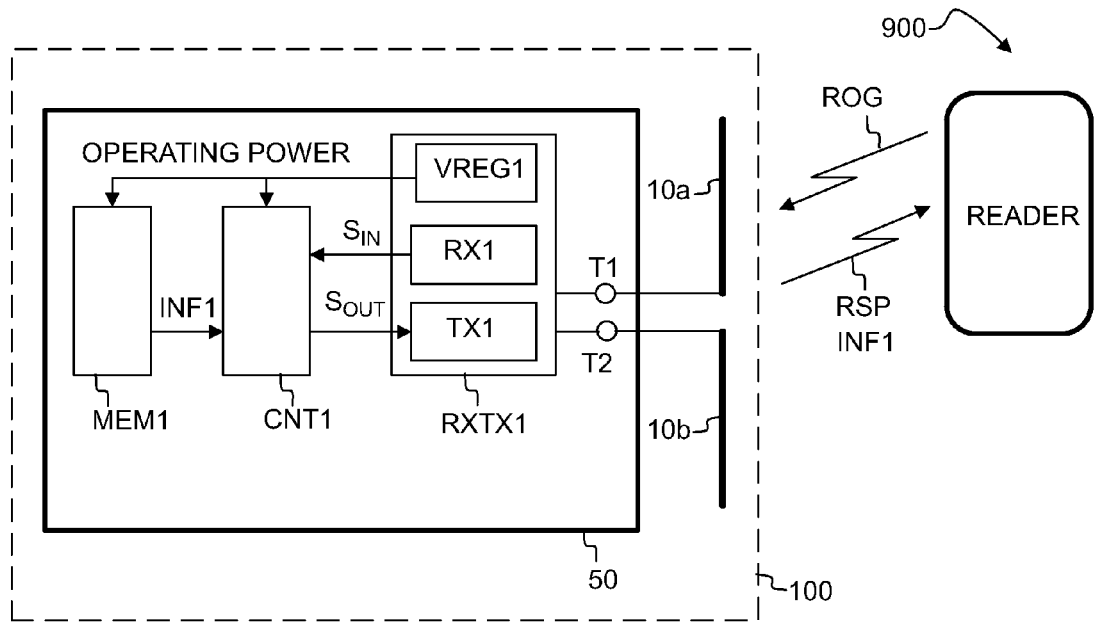

Referring to FIG. 15, a radio frequency identification transponder 100 may be arranged to send a response RSP to an interrogation signal ROG. The interrogation signal ROG may be sent from a portable or stationary reader 900.

The transponder 100 may comprise a communication block connected to one or more antenna elements 10a, 10b via terminals T1, T2. The terminals T1, T2 may be galvanically connected to the contact elements 52a, 52b of the chip 50.

The communication block may be implemented in an RFID chip 50. The communication block may comprise a radio frequency unit RXTX1, a control unit CNT1, and a memory MEM1. The radio frequency unit RXTX1 may comprise a signal receiver RX1, and a signal transmitter TX1.

The radio frequency unit RXTX1, the control unit CNT1, and the memory MEM1 may be implemented on the same semiconductor chip 50.

The receiver RX1 may provide an input signal $S_{IN}$ based on the received interrogation signal ROG. The control unit CNT1 may be arranged to enable transmission of the information INF1 e.g. when the input signal $S_{IN}$ contains a correct password code.

The response RSP transmitted by the transponder 100 may comprise information INF1. The information INF1 may comprise e.g. an electronic item code (EPC). The information INF1 may be retrieved from the memory MEM1 by the control unit CNT1. The control unit CNT1 may send an output signal $S_{OUT}$ to the radio frequency unit RXTX1. The output signal $S_{OUT}$ may comprise the information INF1. The transmitter TX1 may generate the radio-frequency response RSP based on the output signal $S_{OUT}$.

The radio frequency unit RXTX1 may comprise a voltage supply VREG1, which is arranged to extract operating power from an incoming radio frequency signal.

FIG. 16 shows a plurality of tagged items 700a, 700b, 700c. An RFID transponder 100a may be attached to the item 700a, An RFID transponder 100b may be attached to the item 700b, and An RFID transponder 100c may be attached to the item 700c.

Each transponder 100a, 100b, 100c, may be arranged to transmit a response RSP to an interrogation signal ROG. A response transmitted by the transponder 100a may comprise information INF1a associated with the item 700a. A response transmitted by the transponder 100b may comprise information INF1b associated with the item 700b. A response transmitted by the transponder 100c may comprise information INF1c associated with the item 700c.

The information INF1 may e.g. comprise identification data for each transponder 100 so that the number of the items 700a, 700b, 700c can be counted, and the type of the items can be identified.

The reader 900 may comprise a body 910 and a user interface 920. The user interface 920 may comprise e.g. a visual display for displaying information sent by the transponders 100, 100a, 100b, 100c. The user interface 920 may comprise a keyboard for receiving data and/or commands.

The radio frequency unit RXTX1 may comprise a signal receiver RX1, and a signal transmitter TX1. The receiver RX1 may also be called as a signal demodulator. The transmitter TX1 may also be called as a signal modulator. The radio frequency unit RXTX1 may also be called as an analog radio frequency interface.

The radio frequency unit RXTX1 may comprise connection terminals T1, T2, which may be connected to at least one antenna 10a, 10b. The at least one antenna may be a dipole antenna, which comprises a pair of antenna elements 10a, 10b. A first terminal T1 may be connected to a first element 10a, and a second terminal T2 may be connected to a second element 10b. Alternatively, the first terminal T1 may be connected to an antenna 10a, and the second terminal T2 may be connected to an electrical ground (not shown). Alternatively, the terminals T1, T2 may be connected to a coil antenna CA1 (FIG. 17b).

In particular, the information INF1 may comprise an electronic item code (EPC). A unique electronic item code assigned to an item may be stored in the tag 200 as a binary number. In particular, a bit string may include information regarding an item such as its retail price, manufacturer, type of the item, serial number, for example.

The input signal $S_{IN}$ and the output signal $S_{OUT}$ may be digital signals.

The reader 900 and the transponder 100 may be arranged to communicate according to a far field communication protocol. The reader 900 and the transponder 100 may be arranged to communicate according to the same RFID communication standard. In particular, the reader 900 and the transponder 100 may be arranged to communicate according to one or more of the following standards:

ISO/IEC 18000-2A (frequency band 125/134.2 kHz, reading distance e.g. up to 2 m)
ISO/IEC 18000-2B (frequency band 125/134.2 kHz)
ISO 18000-3 (frequency band 13.56 MHz, reading distance e.g. up to 3 m)
ISO 18000-7 (frequency band 433 MHz)
ISO 18000-6A (frequency band 860-960 MHz, reading distance e.g. up to 3 m)
ISO 18000-6B (frequency band 860-960 MHz)
ISO 18000-6C (frequency band 860-960 MHz)
EPCglobal Class 0 (frequency band 860-960 MHz)
EPCglobal Class 1 (frequency band 860-960 MHz)
EPCglobal Class 1 Gen 2 (frequency band 860-960 MHz)
ISO 18000-4 (frequency band 2.45 GHz, reading range e.g. up to 12 meters)
(Reference is made to the latest versions of the standards as in force on 1 Jan. 2010).

The reader 900 and the tag 100 may be arranged to communicate according to a near field communication protocol (NFC). In particular, the reader 900 and the tag 100 may be arranged to communicate according to one of the following standards:

Proximity cards: ISO/IEC 14443 (frequency band 13.56 MHz, reading distance e.g. up to 12.5 cm)
Vicinity cards: ISO/IEC 15693 (frequency band 13.56 MHz, reading distance e.g. up to 1.5 m)
(Reference is made to the latest versions of the standards as in force on 1 Jan. 2010).

The radio frequency unit RXTX1 may comprise a voltage supply VREG1, which is arranged to extract operating power from an incoming radio frequency signal. In particular, the voltage supply VREG1 may be arranged to extract operating power from the interrogation signal ROG. The operating power may be distributed to the control unit CNT1, to the memory MEM1 and/or to the radio frequency unit RXTX1 itself.

The transponder 100 may be a passive device which does not comprise a battery. The transponder 100 may be powered e.g. by electro-magnetic energy transmitted from the reader 900. In particular, the combination of an antenna structure 10a,10b,CA1 and a radio frequency unit RXTX1 of a transponder 100 may be arranged to provide operating power for the transponder 100 by extracting energy of an in-coming electromagnetic signal ROG.

A dipole antenna 10a, 10b may transmit information INF1 from the tag 200 to the reader 900 by back scattering. Alternatively, an inductive antenna may be used. A coil antenna CA1 of the transponder 100 may cause modulation of the load for the reader 900. This modulation can be used for transmitting data from the transponder 100 to the reader 900.

The transponder 100 may be an active device, which comprises a battery for providing operating power for the radio frequency unit RXTX1.

The transponder 100 may be battery-assisted, i.e. power provided by a battery may be used for processing information and/or storing information in the memory MEM1, and the response RSP may be transmitted by using reflected power of the interrogation signal ROG (by using passive reflected power).

The transponder 100 may comprise a capacitor or rechargeable battery for storing operating energy extracted from an interrogation signal ROG.

Electromagnetic interrogation signal ROG transmitted in a wireless manner is converted into an electrical signal by the antenna elements 10a, 10b. The electrical signal is connected to the receiver RX1 of the radio frequency unit RXTX1 via the connection terminals T1 and T2. Also the electrical signal is a radio frequency signal, which oscillates at the same frequency as the electromagnetic signal.

Figure 17A:
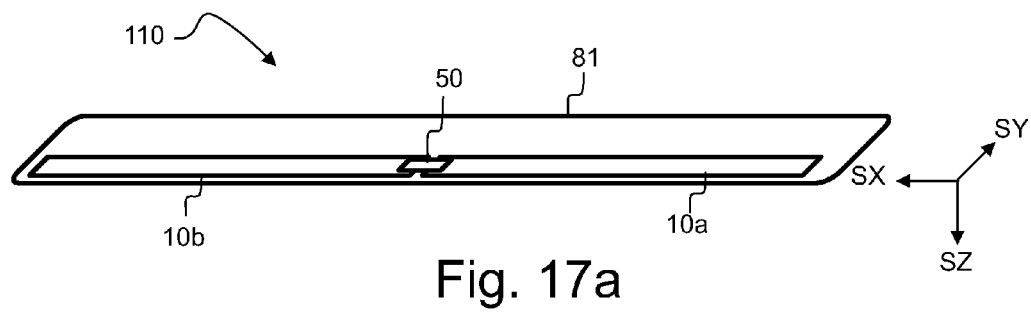
FIG. 17a shows an RFID tag comprising a dipole antenna.
Figure 17B:
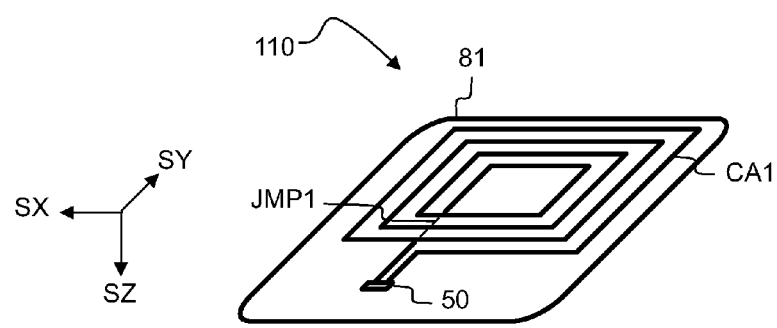
FIG. 17b shows an RFID tag comprising an inductive antenna and a jump wire.

FIG. 17a shows a tag 110 which comprises a dipole antenna comprising antenna elements 10a, 10b.

FIG. 17b shows a tag 110 which comprises a coil antenna CA1 and a jump wire JMP1.

Figure 17C:
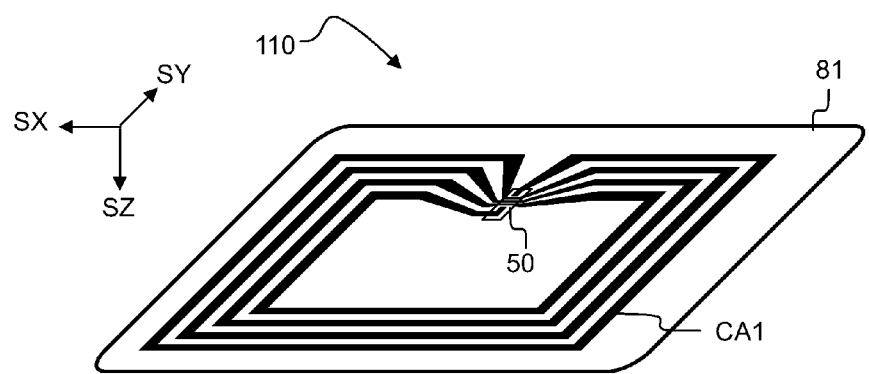
FIG. 17c shows an RFID tag comprising an inductive antenna, wherein turns of the inductive antenna pass between the terminal portions.

FIG. 17c shows a tag 110 which comprises a coil antenna CA1. The turns of the coil antenna CA1 are arranged to pass between the contact elements of the chip 50 such that an external jump wire is not needed.

The chip 50 may comprise a transponder 100 implemented by integrated circuits. The antenna elements 10a, 10b, CA1 and the chip 50 may be supported on a substrate 81. The substrate 81 may be e.g. paper, cardboard, or plastic film.

However, in an embodiment, the antenna elements may be implemented without the substrate 81. Less than 20% of the surface area of the antenna element (10a, 10b, CA1) may be covered by a dielectric material.

The total thickness of a tag 110 or a transponder 100 (in the direction SZ) may be smaller than or equal to 1 mm. The tag 110 or a transponder 100 may be flexible. A tag 110 may further comprise an adhesive layer (not shown). A tag 110 may further comprise a release layer, which protects the adhesive layer. The release layer can be removed before the tag 110 is attached to an item (e.g. 700a) by the adhesive layer.

The tag 110 or a transponder 100 may be attached or associated with an item 700a (See FIG. 16). The item 700a may be a product, e.g. a television, mobile phone, component of an automobile. The item 700a may be a package containing an item, a package containing foodstuff, a package containing medicine, a package containing a chemical substance.

In an embodiment, an item 700a may be substantially thicker than an RFID transponder 100 or an RFID tag 110. The thickness of the item 700a may be e.g. greater than or equal to 10 mm. In an embodiment, an RFID transponder 100 may be embedded in the item 700a or otherwise attached to the item 700a such there is no need to use a substrate film between the antenna element(s) and the item 700a. Thus, the use of materials may be minimized in an environmentally friendly way.

A plurality of tagged items 700a, 700b, 700c may stored in a storage, and a user may rapidly make an inventory of the items 700a, 700b, 700c stored in said storage by receiving the information INF1.

Advantageously, the chip 50 comprises encapsulation (i.e. housing). Two or more portions of the outer surface of chip 50 may be electrically conductive such that they can be used as the contact elements 52a, 52b. The contact elements 52a, 52 are exposed before they are electrically connected to the antenna portions 10a, 10b.

Advantageously, the contact elements 52a, 52b may protrude from the (dielectric) encapsulation so that a distance h2 (FIG. 18) between the conductive sheet 70 and a dielectric surface of the chip 50 is greater than zero.

The encapsulation may be arranged to mechanically protect the electronic components of the chip 50 and/or to prevent corrosion of the electronic components. In particular, the encapsulation may protect the electronic components from moisture. The moisture may induce corrosion and may have and adverse effect on the electrical properties of the electronic components. The encapsulation may comprise e.g. polymer material and/or ceramic material. The polymer material may comprise e.g. thermoplastic polymer, thermosetting polymer or elastomer. The electronic components of the chip 50 may be e.g. transistors, diodes, capacitors and resistors implemented on a layer of semiconductor material.

In certain cases, there is a risk that the laser beam LB1 used for cutting the sheet 70 may damage the chip 50. The chip 50 may be considered to be damaged e.g. in one or more of the following cases:
- one or more electronic components of the chip are damaged due to heat and/or due to ablation of material,
- the mechanical strength of the encapsulation of the chip is substantially reduced due to heat and/or ablation of material,
- the capability of the encapsulation of the chip to protect the semiconductor components from chemical corrosion is substantially reduced,
- the capability of the encapsulation of the chip to prevent penetration of moisture to the electronic components is substantially reduced.

Alternatively, a chip 50 attached to a transponder 100 may also be implemented without encapsulation in order to minimize manufacturing costs.

Figure 18:
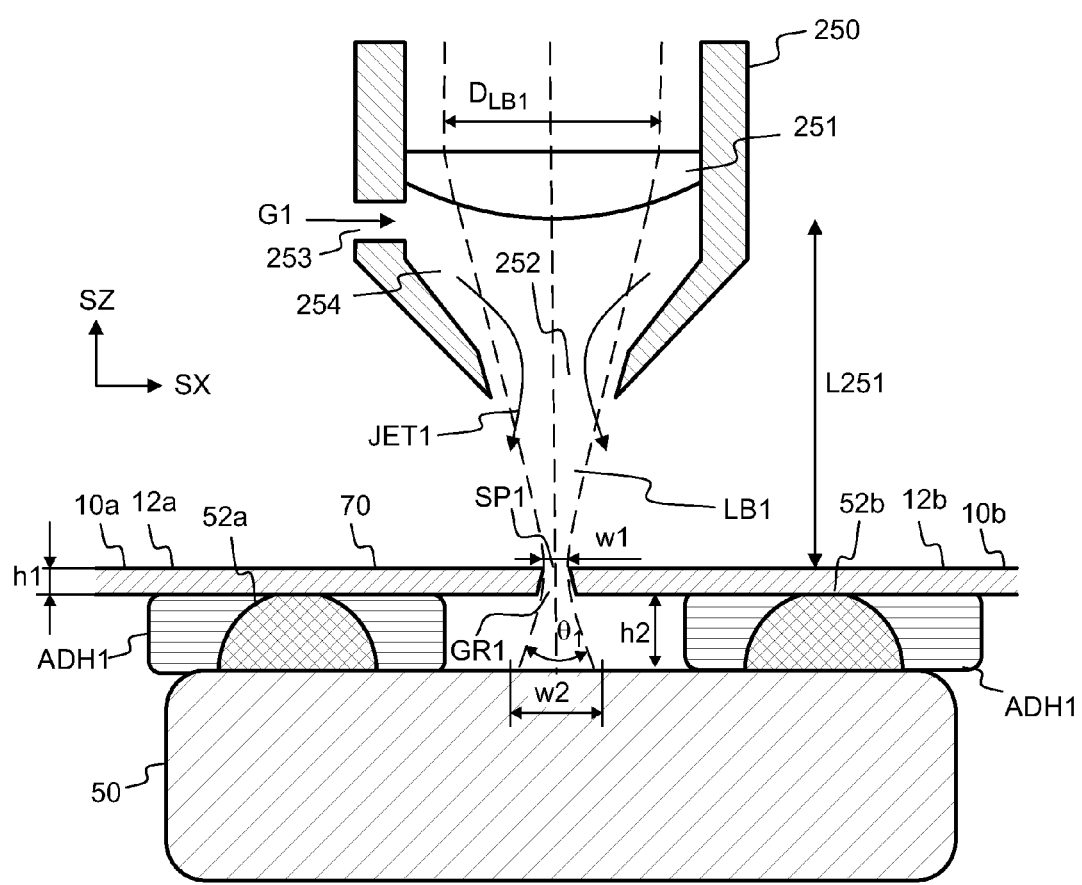
FIG. 18 shows, in a side view, cutting of the conductive sheet by using a diverging laser beam.

Referring to FIG. 18, the laser beam LB1 provided by a laser 250 may be a diverging beam in order to reduce the intensity impinging on the chip 50. The divergence angle $\theta_1$ of the beam LB1 may be e.g. larger than 10° after passing through the groove GR1 cut in the sheet 70.

To the first approximation, a lower limit for the divergence angle $\theta_1$ may be typically determined by the ratio of the initial width $D_{LB1}$ of the beam LB1 to the focal length L251 of the focusing optics 251. The groove GR1 cut by the laser beam LB1 may also operate as an aperture stop, which increases the divergence angle $\theta_1$ by diffraction. Reflections from the surfaces of the groove GR1 may even further increase the divergence angle $\theta_1$. Thus the divergence angle $\theta_1$ may be greater than or equal to the ratio $D_{LB1}/L251$.

Thanks to the diverging beam LB1, the maximum intensity of laser radiation impinging on the surface of the chip 50 during the cutting may be substantially smaller than the maximum intensity impinging on the conductive sheet 70 during the cutting.

w1 denotes the width of the beam LB1 at the upper surface of the conductive sheet 70. w2 denotes the width of the beam LB1 at the surface of the chip 50. h1 denotes the thickness of the sheet 70. h2 denotes the distance between the sheet and the chip 50.

The divergence angle $\theta_1$ and/or the distance h2 may be selected such that the maximum intensity at the level of the surface of the chip 50 is lower than 20% of the maximum intensity at the level of the upper surface of the sheet 70, advantageously lower than 10%, and preferably lower than 5%. Yet, the divergence angle $\theta_1$ of the beam LB1 and/or the distance h2 may be selected such that the maximum intensity at the level of the surface of the chip 50 is lower than 1% of the maximum intensity at the level of the upper surface of the sheet 70.

The divergence angle $\theta_1$ of the laser beam LB1 and the distance h2 between the conductive sheet 70 and the chip 50 may be selected such that the width w2 of an area of the chip 50 exposed to laser radiation is greater than three times the width w1 of the laser spot SP1 on the conductive sheet 70. Advantageously, the width w2 of an area of the chip 50 exposed to laser radiation is greater than ten times the width w1 of the laser spot SP1 on the conductive sheet 70

The space between the conductive sheet 70 and the chip 50 may be filled with gas when the cutting with the laser beam is started.

Alternatively, the space between the conductive sheet 70 and the chip 50 may be partially (but not completely) or completely filled with an adhesive ADH1. The adhesive ADH1 may be transparent or translucent at the wavelength of the laser beam. The shape of the interface between the adhesive and the surrounding gas may be rather uneven (i.e. not flat and/or not smooth). Laser light refracted at the interface may propagate to the surface of the chip 50 through the adhesive ADH1. The uneven surface of the adhesive may further distribute laser light to a larger area, thanks to the refraction at the uneven interface.

The laser 250 may comprise a laser cutting head. The laser 250 may comprise optics 251 for focusing the laser beam LB1 to a narrow spot SP1.

The groove GR1 cut by the laser beam may also be called as a "kerf". The groove GR1 may separate a first antenna element 10*a* from a second antenna element 10*b*. In particular, the groove GR1 between a first contact element 52 and a second contact element 52*b* may separate a first terminal portion 12*a* from a second terminal portion 12*b*.

Figure 26:
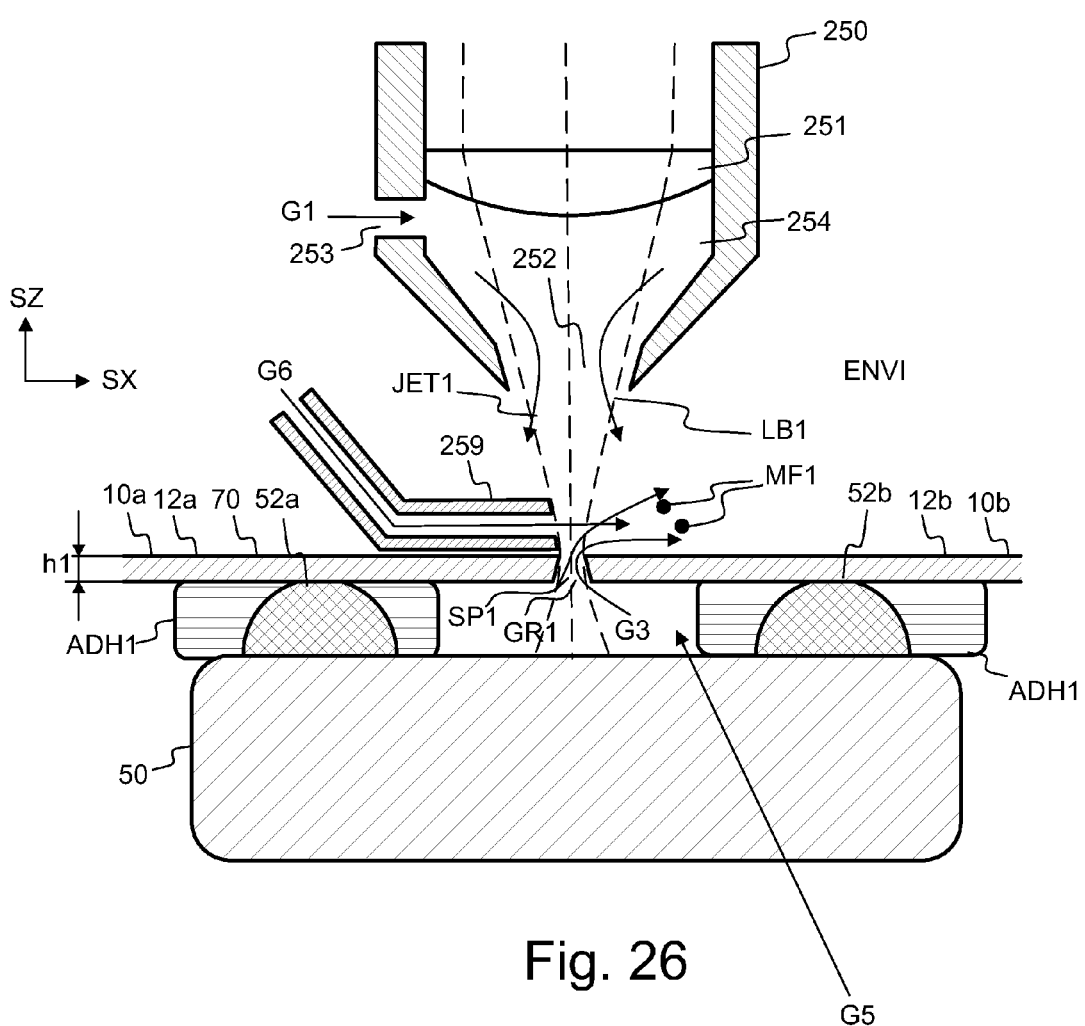
FIG. 26 shows, in a side view, a gas stream arranged to create suction.

The material of the sheet 70 at the location of the groove GR1 may be converted into particles MF1 (see e.g. FIG. 26).

The laser 250 may have an orifice (nozzle) 252 for providing a gas stream JET1. The gas stream JET1 may have one or more of the following functions:
- to prevent contamination of the optics 251 due to metal fume and vapors,
- to cool the sheet 70 and/or the chip 50,
- to provide inert gas, which protects the groove GR1,
- to provide oxidizing gas in order to oxidize surfaces of the groove cut by the laser,
- to provide oxidizing gas in order to oxidize particles removed from the groove,
- to provide gas, which reacts with the metal heated the laser beam LB1,
- to provide gas, which blows away particles from the groove.

The laser 250 may have a second opening 253 for guiding a gas flow G1 into a plenum chamber 252. A pressure difference between the plenum chamber 254 and the environment may provide the gas stream JET1 through the orifice 252.

Figure 19:
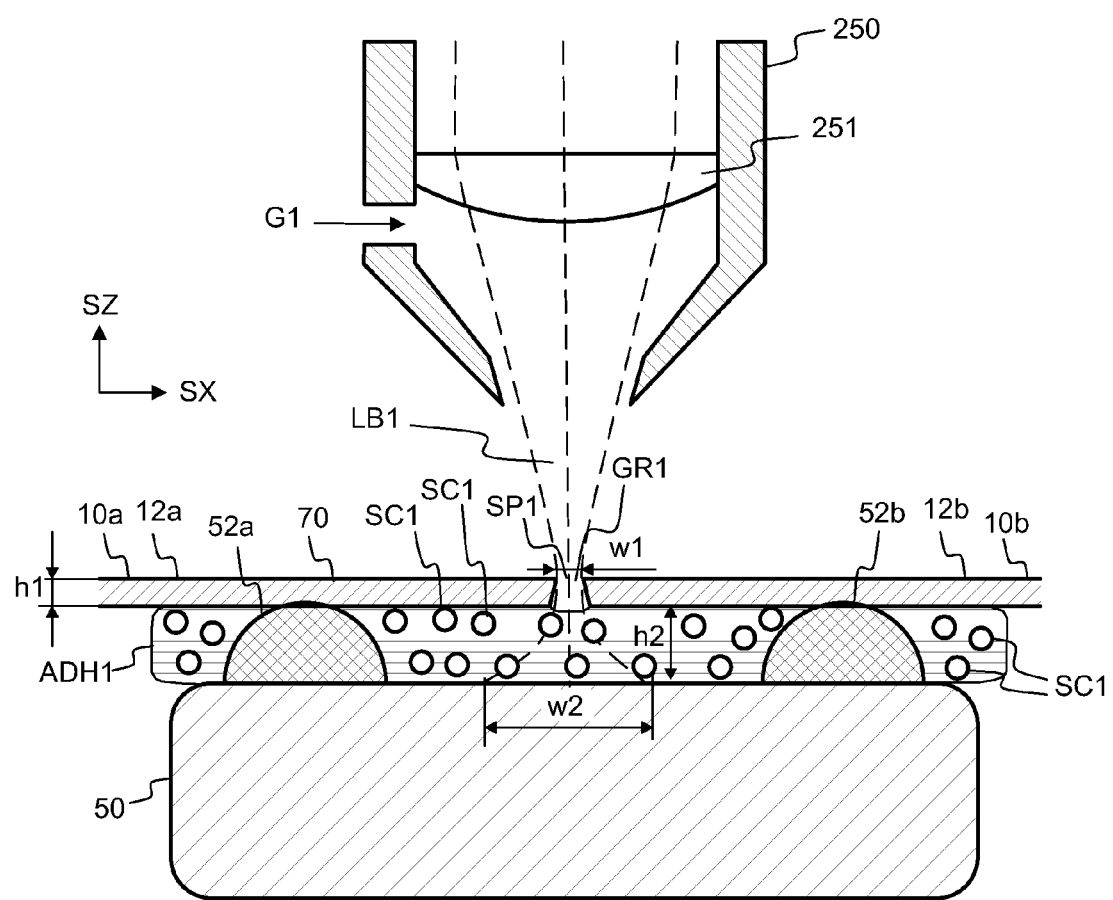
FIG. 19 shows, in a side view, using scattering centers to reduce intensity of laser radiation impinging on the RFID chip.

Referring to FIG. 19, the intensity of light impinging on the chip 50 may be reduced by arranging a plurality of scattering centers SC1 to scatter light of the laser beam LB1. The scattering centers SC1 may be e.g. particles mixed with adhesive material. The adhesive ADH1 may comprise e.g. titanium dioxide ($TiO_2$) particles, aluminum oxide particles ($Al_2O_3$) quartz particles ($SiO_2$) glass particles, and/or kaolin particles mixed with an adhesive material. The width of the particles SC1 may be e.g. in the range of 200 nm to 25 µm. In particular, the diameter of the particles SC1 may be e.g. in the range of 200 nm to 25 µm. The particles and the adhesive material may be substantially transparent or translucent at the wavelength of the laser beam LB1

The scattering centers (particles) SC1 may be e.g. spherical, cubic or elongated fibrous particles. In particular, light-scattering fibers SC1 may form a reinforced composite together with the adhesive material.

Thanks to the scattering, the maximum intensity at the level of the surface of the chip 50 may be substantially reduced when compared with a situation where the scattering centers are not present.

The adhesive ADH1 may also absorb light at the wavelength of the laser beam LB1. If the adhesive ADH1 contains particles SC1, the particles may also absorb light at the wavelength of the laser beam LB1. The adhesive ADH1 may be arranged to operate as a sacrificial layer, which is arranged to protect the chip.

The adhesive ADH1 may contain a material, which undergoes a reversible or irreversible phase transformation (e.g. melting) due to heating caused by the laser beam LB1. This may reduce the maximum temperature of the surface of the chip 50. The adhesive ADH1 may contain e.g. a hot melt adhesive.

The adhesive ADH1 may be electrically insulating in order to avoid short-circuiting the contact elements 52a, 52b.

The adhesive ADH1 may be electrically conductive in the regions between the contact elements 52a, 52b if the adhesive ADH1 in the transponder 100 is split into two or more separate zones. In case of electrically conductive adhesive ADH1, the manufacturing method may comprise cutting a groove in the conductive sheet 70 by a laser beam LB1, and locally removing adhesive ADH1 from a region, which is located under the groove such that the groove extends to the surface of the chip 50.

Also the adhesive ADH1 may be removed by using the laser beam LB1. The cutting of the conductive sheet 70 may be carried out by using a first intensity of the beam LB1, and removing the adhesive ADH1 may be carried out by using a second substantially lower intensity. Also in this case, the risk of damaging the chip 50 may be substantially reduced, because the adhesive ADH1 may be removed by using a lower power than when cutting the conductive sheet 70. The underlying adhesive layer ADH1 may be arranged to operate as a protective (sacrificial) layer, which protects the surface of the chip 50 from the high intensity used when cutting the conductive sheet 50.

The adhesive ADH1 may contain particles SC1, which are electrically conducting and/or which absorb laser radiation. The particles SC1 may be e.g. carbon particles or metal particles. In particular, the adhesive ADH1 may be an anisotropically conductive adhesive containing conductive particles.

Figure 20:
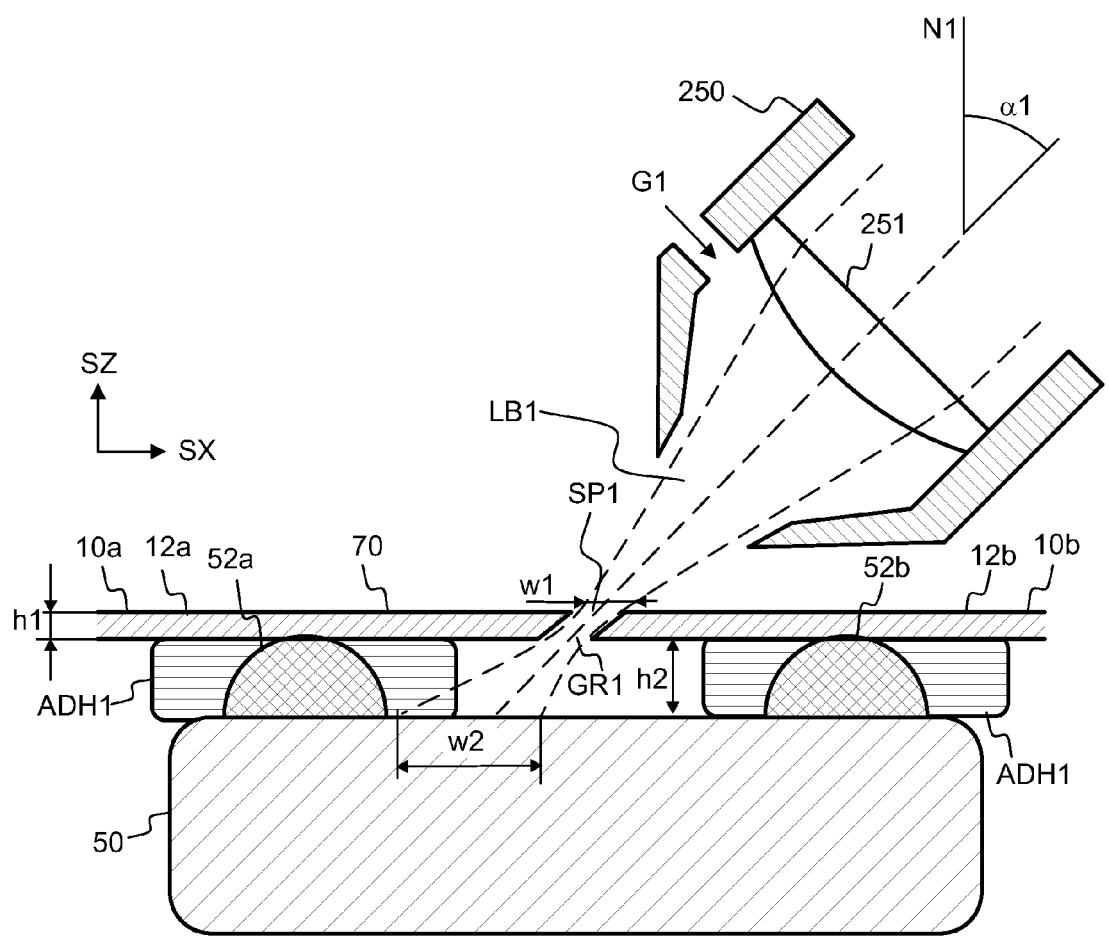
FIG. 20 shows, in a side view, cutting by using a tilted laser beam.

Referring to FIG. 20, the laser beam LB1 may be tilted, i.e. the angle $\alpha 1$ between the centerline of the beam LB1 impinging on the conductive sheet 70 and the normal N1 of the conductive sheet 70 may substantially deviate from zero. Using the tilted beam LB1 may substantially increase the length of the optical path between the sheet 70 and the surface of the chip 50. The inclined orientation of the beam LB1 may increase the width w2 of the beam at the surface of the chip 50, in order to reduce the intensity at the surface of the chip 50.

The input angle $\alpha 1$ may be e.g. greater than 30°. The angle $\alpha 1$ may be e.g. in the range of 30° to 70°.

Figure 21:
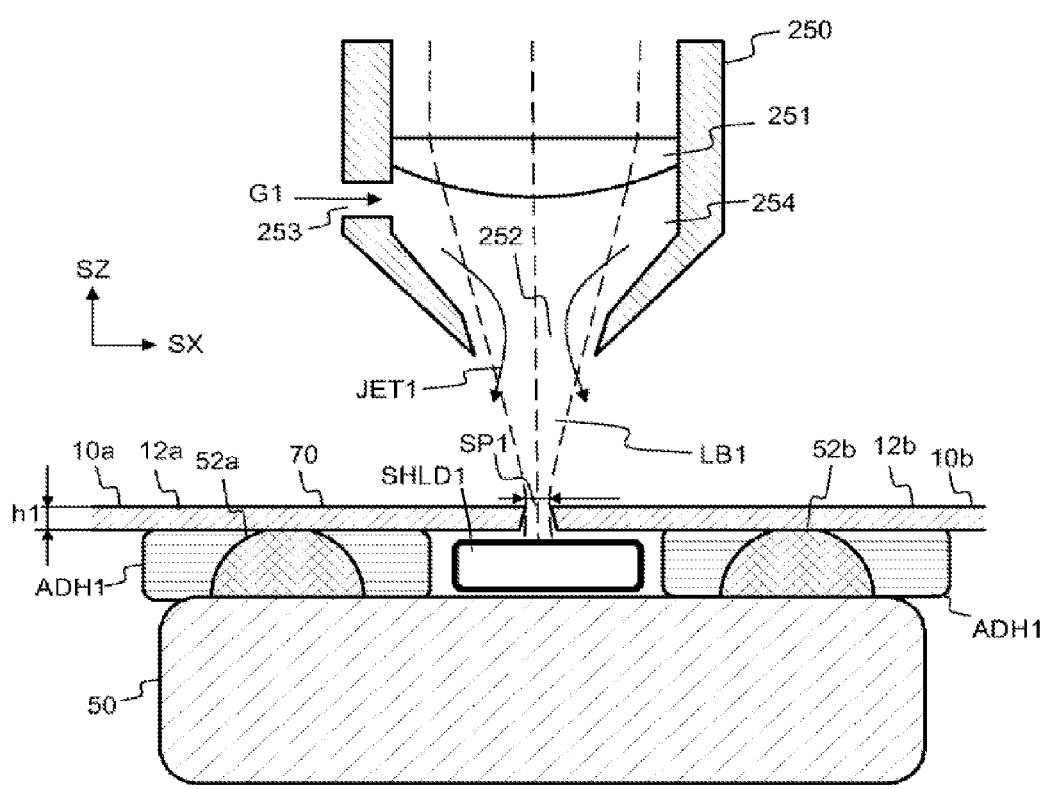
FIG. 21 shows, in a side view, protecting the RFID chip with a protective mask.

Referring to FIG. 21, a removable mask SHLD1 (i.e. a shield) may be temporarily positioned between the sheet 70 and the chip 50 in order to avoid damaging the chip 50. The mask SHLD1 may comprise one or more microchannels. A coolant fluid may be arranged to flow in the microchannels in order to cool the mask SHLD1. The mask may have a reflecting surface for reflecting light of the beam LB1, in order to reduce heat load on the mask SHLD1.

The operating parameters of the laser beam may be selected such that the mask SHLD1 may be damaged due to the laser beam LB1. In this case the mask SHLD1 may be made of a disposable and/or recyclable material. In particular, the removable mask SHLD1 may comprise copper sheet or aluminum sheet.

The mask SHLD1 may be removed after the conductive sheet 70 has been cut.

Figure 22A:
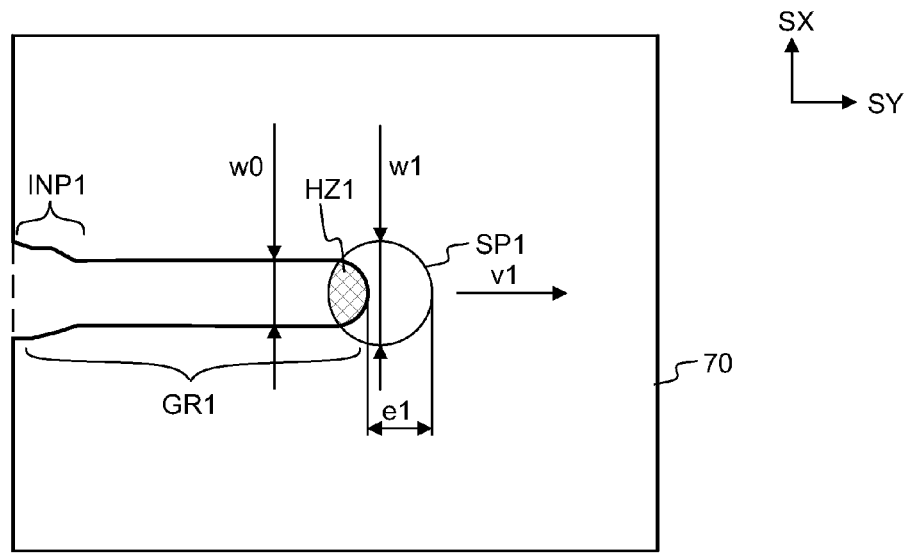
FIG. 22a shows, in a top view, cutting of a groove.
Figure 22B:
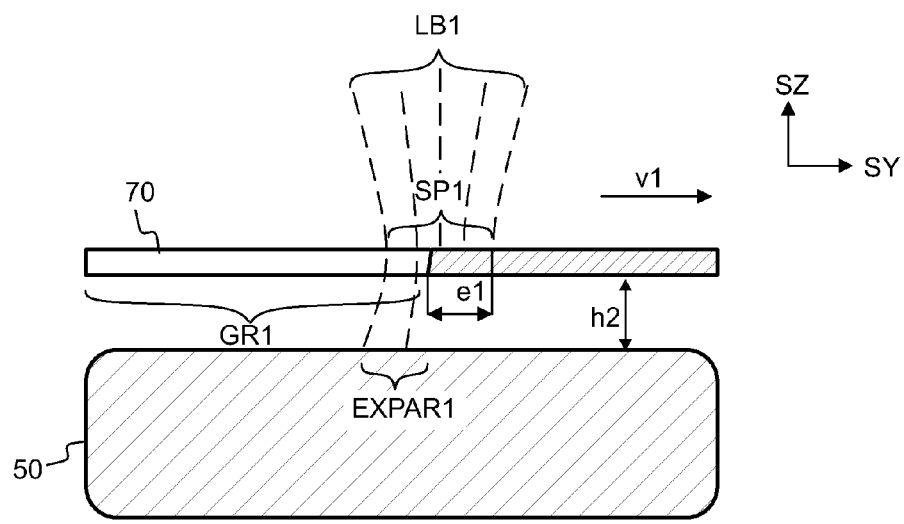
FIG. 22b shows, in a side view, cutting of the groove according to FIG. 22a, FIG. 22c shows, in a top view, a cutting pattern having a crossing, wherein the crossing is located within the projected area of the chip.

FIG. 22a shows, in a detailed top view, cutting of a groove GR1 by the laser beam LB1. FIG. 22b shows, in a side view, the same cutting situation as in FIG. 22a.

When the laser spot SP1 is moving at a substantially constant velocity v1 and sufficiently far away from the edges of the sheet 70, the laser cutting may be interpreted to take place in a steady state.

There may be a distance e1 between the leading edge of the laser spot SP1 and the leading end of the groove GR1. The width w0 of the groove GR1 may be substantially smaller than the width w1 of the laser spot SP1 in the steady state. Consequently, only a fraction of the power of the laser beam LB1 may pass through the groove GR1. The portion of the beam passing to the other side of the sheet 70 is shown with the hatched area HZ1.

The attenuating effect of the groove GR1 means that the power of laser radiation impinging on the area EXPAR1 of the chip 50 may be substantially smaller than the initial power of the laser beam LB1. Furthermore, if the radiation transmitted through the groove GR1 diverges, the intensity impinging on the area EXPAR1 of the chip 50 may be substantially reduced. The divergence may be increased e.g. by diffraction caused by the groove, by scattering caused by particles SC1, and/or by refraction at the interface between a gas and the adhesive.

The attenuating effect of the groove GR1 may be utilized to protect the chip 50 during steady state cutting. However, if the attenuating effect of the groove GR1 is relied upon, the control of the process parameters may need to be rather accurate, i.e. the allowable range of variation of the process parameters of the cutting process may be narrow.

Accurate control of the width of the groove GR1 may be difficult in the portion INP1 close to an edge of the sheet 70. It should be noticed that also a previously cut (first) groove may form an edge of the sheet 70 when cutting a subsequent (second) groove. The first groove may form an edge for cutting the second groove.

Figure 22C:
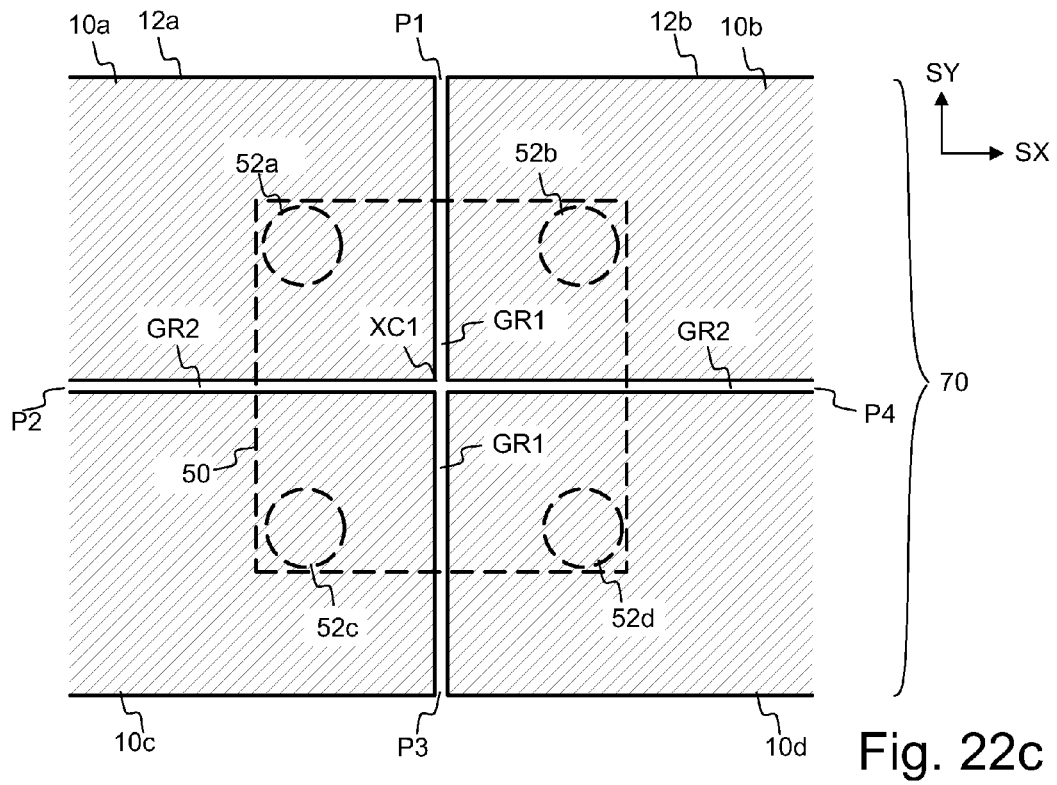
FIG. 22d shows, in a top view, a cutting pattern, wherein the branching points of the grooves are located outside the projected area of the chip.
FIG. 22e shows, in a top view, a cutting pattern for providing three separate antenna portions.
FIG. 22f shows, in a top view, a cutting pattern having curved grooves.

FIG. 22c shows, in a top view, cutting the conductive sheet 70 into portions 10a, 10b, 10c, 10d. A branching point XC1 may be located at the intersection of two grooves GR1,GR2 cut by a laser beam LB1. The conductive sheet 70 may be cut along a first line joining the points P1 and P3, and along a second line joining the points P2 and P4. The first groove GR1 and the second groove GR2 may intersect at the branching point XC1.

If the second groove GR2 continues on the other side of the first groove GR1, the branching point XC1 may be called as a crossing point.

A relatively high intensity may be required for cutting the conductive sheet 70. The intensity used for cutting the conductive sheet 70 may be so high that the laser radiation impinging on the chip 50 may damage the chip 50.

The groove GR1 cut by the laser beam LB1 may be arranged to attenuate the intensity. The attenuation by the groove may help to avoid damaging the chip 50.

In particular, the groove may substantially attenuate the intensity of the laser beam LB1 during steady state cutting of the sheet 70, thanks to absorption, scattering and/or reflection caused by the groove GR1 and the conductive sheet 70. Metal particles, metal oxide particles (metal fume) and/or laser plasma may also attenuate the laser beam.

Due to the attenuation, the power transmitted to the other side of the sheet may be e.g. lower than 20% of the initial power of the laser beam LB1, advantageously lower than 10%, and preferably lower than 5%.

The cutting parameters during steady state cutting may be selected such that the width w0 of the groove GR1 cut by the laser beam LB1 is substantially narrower than the width w1 of the laser spot SP1 moving at the surface of the conductive sheet 70, wherein the groove GR1 may effectively reduces the intensity of laser radiation transmitted through the groove GR1

The cutting parameters may comprise e.g. speed v1 of the spot SP1 on the conductive sheet 70, laser power, laser pulse length, temporal length of interval between subsequent laser pulses.

It may be so that the sheet does not significantly attenuate the power of the laser beam LB1 at the starting point and/or at the end of a groove. The power of the laser beam LB1 and/or timing of laser pulses may be controlled in order to reduce the risk of damaging the chip 50 at the starting point and/or at the end of a groove GR1 cut by the laser beam LB1. However, controlling the power and/or timing may be difficult and/or it may involve e.g. using a monitoring unit (e.g. a machine vision unit) and/or a power control unit, which has a fast response. The allowable range of variation of the process parameters may be narrow.

The intersection XC1 of a first groove GR1 with a second previously cut groove GR2 may represent a starting point and/or an end point. If a laser beam LB1 focused at the starting point/end point of a groove impinges on the chip 50 beneath the conductive sheet 50, this may involve a risk of damaging the chip 50.

In fact, initiation of the cutting may also require that the movement of the spot SP1 (with respect to the sheet 70) is temporarily stopped and/or the intensity at the spot SP1 is temporarily increased. This requirement may be in contradiction when trying to avoid damaging the chip 50.

In FIG. 22c, the branching point XC1 is located within the projected area of the chip 50. The projected area is the rectilinear parallel projection of the chip 50 onto the conductive sheet 70. When viewed from a direction SZ perpendicular to the conductive sheet 70, said projected area coincides with the chip 50.

A problem with the cutting pattern of FIG. 22c is that the surface of the chip 50 may be exposed to a high intensity when the moving laser spot SP1 coincides with the branching point XC1. This may be a risk in particular when the laser beam LB1 has a small input angle α1, in particular when the beam LB1 is substantially perpendicular to the conductive sheet 70.

Initiation of the cutting may comprise forming a keyhole, i.e. a narrow pit or hole, which substantially increases the relative fraction of optical energy absorbed in the conductive sheet 70, when compared with a smooth metal surface. In an embodiment, the cutting may be started with a first higher intensity level, and the cutting may be continued at a second lower intensity level after the keyhole has been formed. However, this kind of power control may make start of the cutting from the branching point XC1 even more difficult as the risk of damaging the chip is high due to the high power at the starting point.

The conductive sheet 70 may be cut into two or more portions (antenna elements) 10a, 10b, 10c, 10d. Each contact element 52, 52b, 52c, 52d may be galvanically connected to an antenna element 10a, 10b, 10c, or 10d.

Figure 22D:
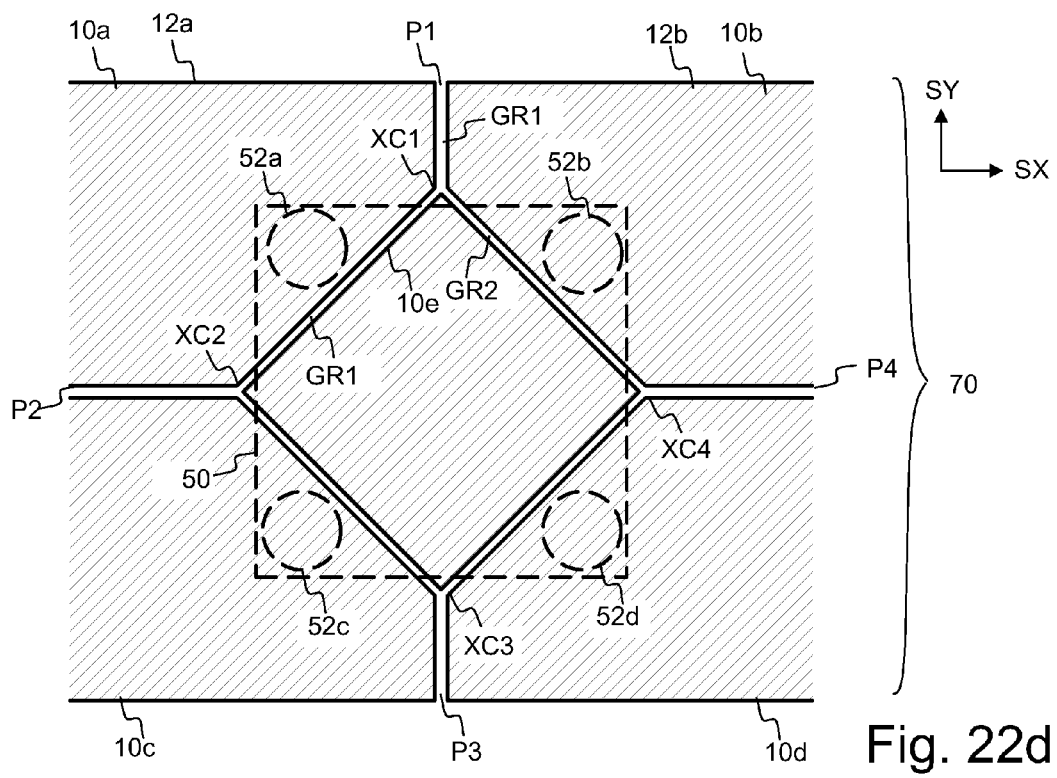

Referring to FIG. 22d, the risk of damaging the chip 50 by the laser may be substantially reduced when at least one of the branching points XC1, XC2, XC3, XC4 is located outside the projected area of the chip 50. Advantageously, all branching points XC1, XC2, XC3, XC4 are located outside the projected area of the chip 50.

When the branching points are located outside the projected area, the risk of damaging the chip 50 may be substantially reduced when using a substantially perpendicular laser beam LB1.

When cutting a branching point, the input angle α1 may be e.g. smaller than 30°. Typically, a higher cutting speed v1 may be used when using a small input angle α1 than when using a large input angle. The laser beam may be substantially perpendicular to the conductive sheet 70 in order to maximize cutting speed and/or to minimize the intensity needed for the cutting.

A first groove may be cut e.g. from the point P1 via the points XC1 and XC2 to the point P2. A second groove may be cut e.g. from the point P4 via the points XC4 and XC3 to the point P3. A third groove may be cut from the branching point XC2 to the branching point XC3. A fourth groove may be cut from the branching point XC1 to the branching point XC4.

A residual portion 10e may be formed in addition to the antenna elements 10a, 10b, 10c, 10d. The residual portion 10e may be subsequently removed or it may be permanently attached to the chip 50 by the adhesive ADH1.

Preferably, each branching point XC1, XC2, XC3, XC4 may be located such that the centerline CNT1 of a cutting beam LB1, which coincides with a branching point XC1, does not intersect the chip 50.

Figure 22E:
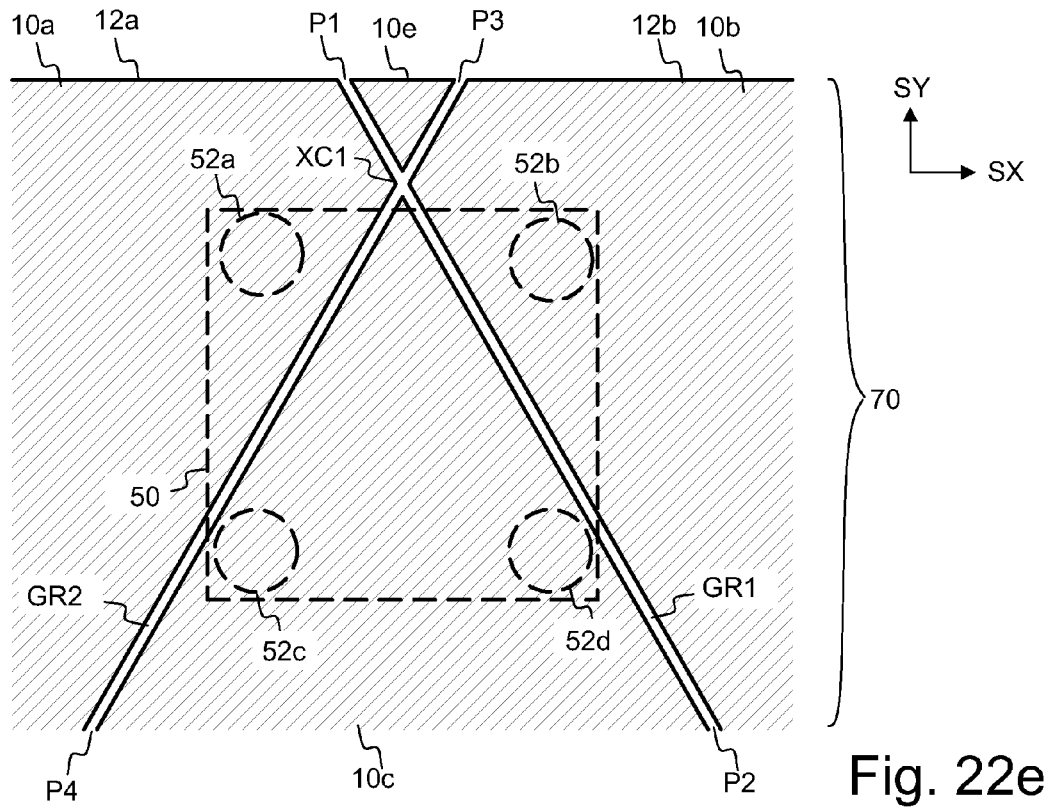

FIG. 22e shows forming three separate antenna portions 10a, 10b, 10c by cutting two grooves GR1, GR2. The first groove GR1 may be cut e.g. between the points P1 and P2. The second groove GR2 may be cut between the points P3 and P4. The residual portion 10e may be removed after cutting. The branching point XC1 may be located outside the projected area of the chip 50. The grooves GR1, GR2 may be substantially linear.

Figure 22F:
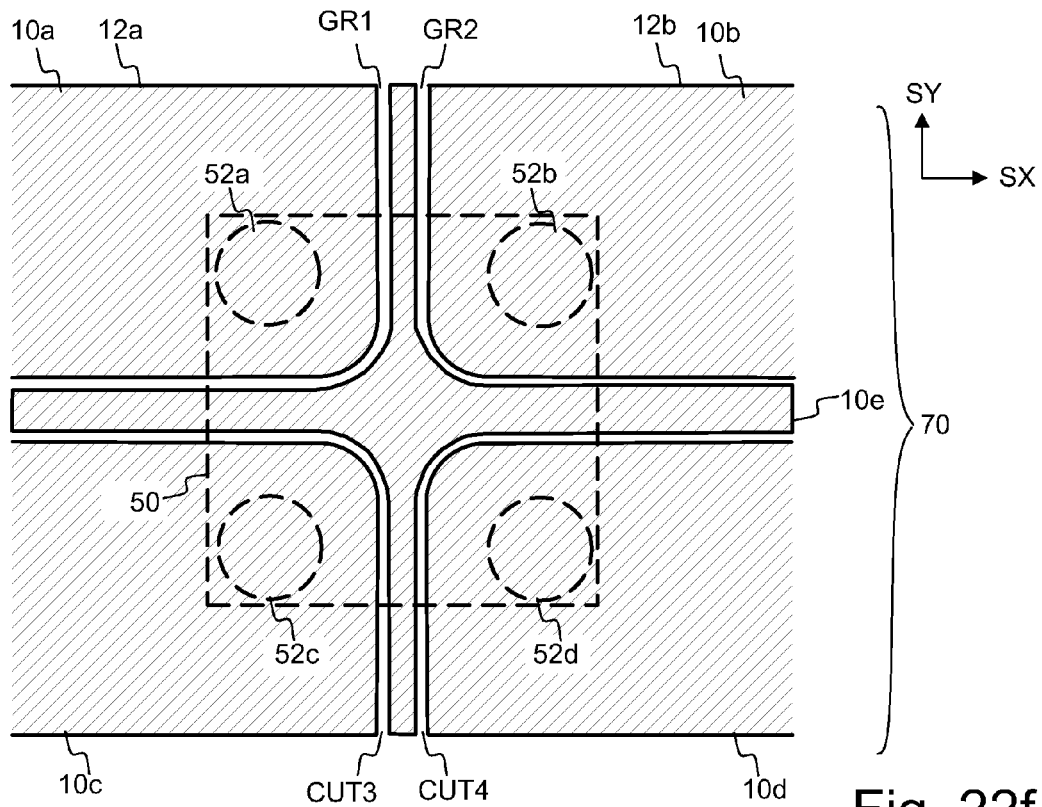

Referring to FIG. 22f, three or more antenna elements 10a, 10b, 10c, 10d may be cut from the sheet 70 without using branching points. Without the branching points, a separate groove may be required to form each antenna element 10a, 10b, 10c, 10d. The residual portion 10e may be removed after cutting e.g. in order to provide a wide electrically insulating gap between the antenna portions 10a, 10b, 10c, 10d. In this case, the residual portion 10e may have overhanging portions which extend beyond the projected area of the chip 50. If the residual portion 10e is not removed, the overhanging portions may be supported e.g. by one or more bridge elements S1 (the use of bridge elements S1 has been explained e.g. in FIG. 8e).

If three or more antenna elements or antenna portions 10a, 10b, 10c, 10d are cut without branching points, the summed length of the grooves may be substantially longer than by using at least one branching point XC1.

Thus, by using at least one branching point XC1, the production speed may be increased.

Figure 23A:
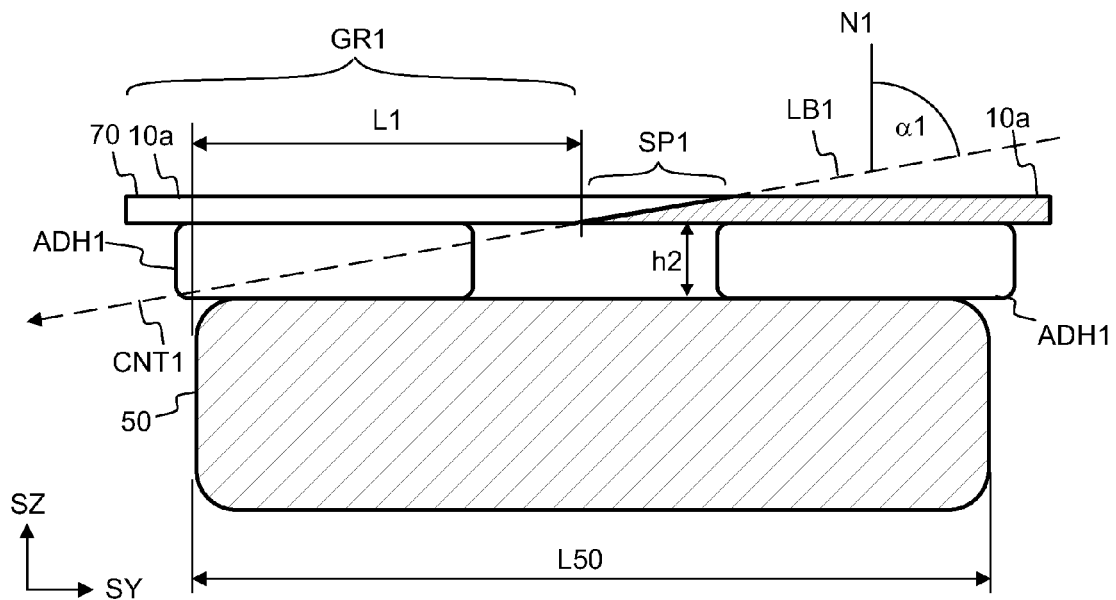
FIG. 23a shows, in a side view, cutting by using a tilted beam such that the centerline of the beam does not intersect the chip.

FIG. 23a shows, in a side view, cutting a groove GR1 by using a tilted laser beam LB1. α1 denotes an angle between the centerline CNT1 of the beam LB1 and the normal N1 of the conductive sheet 70. The intensity of light impinging on the chip 50 may be substantially reduced when the dimension L1 of the groove GR1 is smaller than $h2 \cdot \tan(\alpha 1)$.

The value L1 may be called as the "reach dimension", and the value $L1_{MAX} = h2 \cdot \tan(\alpha 1)$ may be called as the "maximum reach dimension".

The input angle α1 of the laser beam LB1 may be selected to be so large that the centerline CNT1 of the laser beam LB1 does not intersect the surface of the chip 50 during cutting a region of the conductive sheet 70 located between the contact elements 52a, 52b.

A separating groove GR1 between two antenna portions 10a, 10b may be cut by using only one orientation of the laser beam LB1 if the width L50 of the chip 50 is smaller than or equal to the maximum reach dimension $L1_{MAX}$, wherein the chip 50 is not substantially exposed to the cutting beam LB1. The (single) groove GR1 may separate the antenna portions 10a, 10b such that the voltage of the first antenna portion 10a may be different from the voltage of the second antenna portion 10b.

Figure 23B:
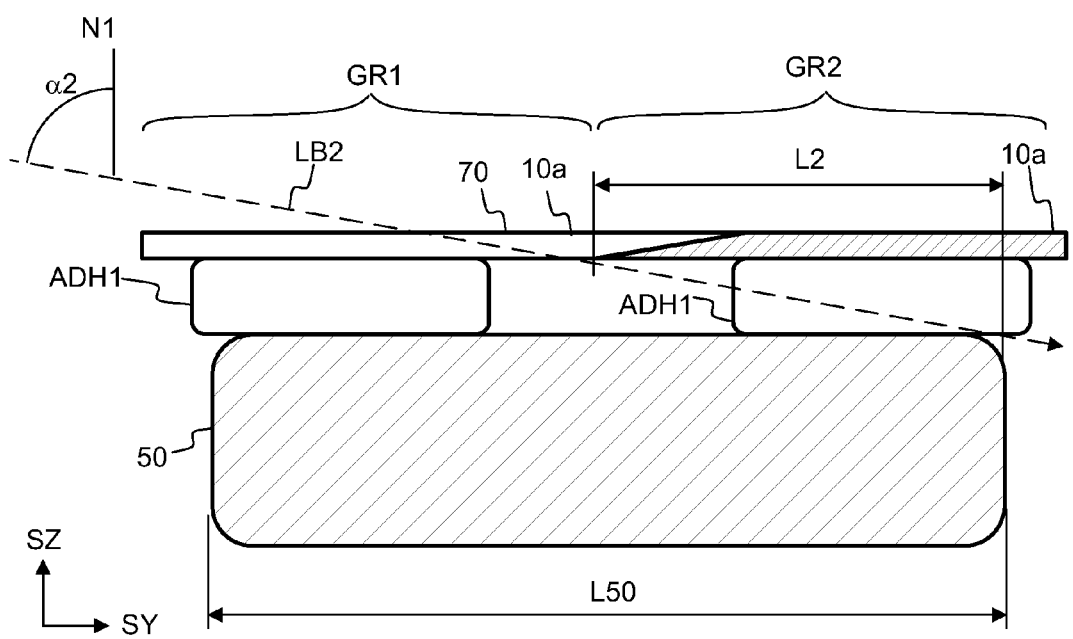
FIG. 23b shows, in a side view, cutting a second adjoining groove with a tilted laser beam.
Figure 25A:
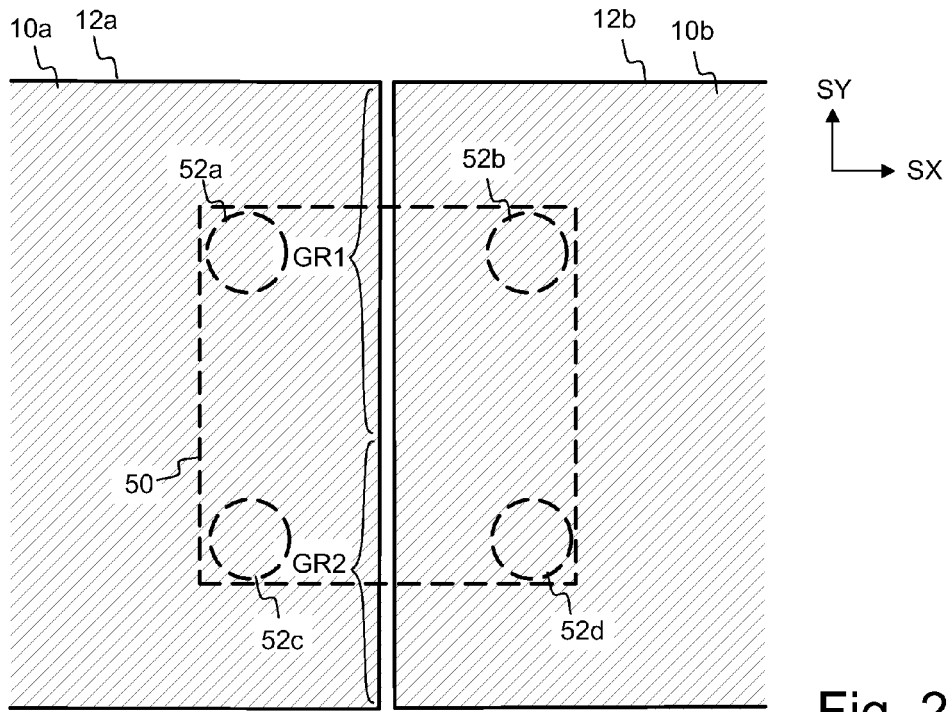
FIG. 25a shows, in a top view, a groove between two terminal portions.

Referring to FIGS. 23b and 25a, a longer groove separating the antenna elements 10a, 10b may be cut so that the surface of the chip 50 is not exposed to the cutting laser beam LB1. The longer groove may be formed by joining two shorter grooves GR1, GR2. A first groove GR1 may be cut by using a first orientation α1 of a laser beam LB1, and a second groove GR2 may be cut by using a second different orientation α2 of a laser beam LB2. The second groove GR2 is joined to the first groove GR1 formed according to FIG. 23a. The longer groove formed by the adjoining grooves GR1, GR2 may separate the antenna portions 10a, 10b such that the voltage of the first antenna portion 10a may be different from the voltage of the second antenna portion 10b. In particular, the longer groove may galvanically separate the first antenna portion 10a from the second antenna portion 10b.

The reach dimension L2 of the groove GR2 may be smaller than maximum reach dimension $L2_{MAX}$=h2·tan(α2) in order to avoid damaging the chip 50. α2 denotes an angle between the centerline of the beam LB2 and the normal N1 of the conductive sheet 70.

The beams LB1 and LB2 may be provided by the same laser 250 or by different lasers. The beams LB1 and LB2 may have different orientations. The angle α1 may be e.g. in the range of 45° to 80°. The angle α2 may be e.g. in the range of −80° to −45° (the angle α2 may be negative and the angle α1 may be positive). The maximum reach dimension $L2_{MAX}$ may be equal to h2·tan(−α2) if the angle α2 is negative.

The reflectivity of the flat surface of the conductive sheet 70 for the laser beam LB1 may be high when the input angle α1 is large. Consequently, absorption of the laser beam in the sheet may be too low to initiate cutting. Cutting of the sheet 70 may be facilitated e.g. by using one or more of the following:
  the cutting may be started at the edge of the sheet 70,
  an initial keyhole may be formed by using a higher power level than during steady state cutting,
  an initial keyhole may be formed by using a smaller input angle (α1) than during steady state cutting, In order to form a longer groove separating the antenna elements 10a, 10b, without exposing the chip 50 to the cutting beams LB1, LB2, the sum of the maximum reach dimensions $L1_{MAX}$+$L2_{MAX}$ may be greater than or equal to the width L50 of the chip 50.

Figure 24:
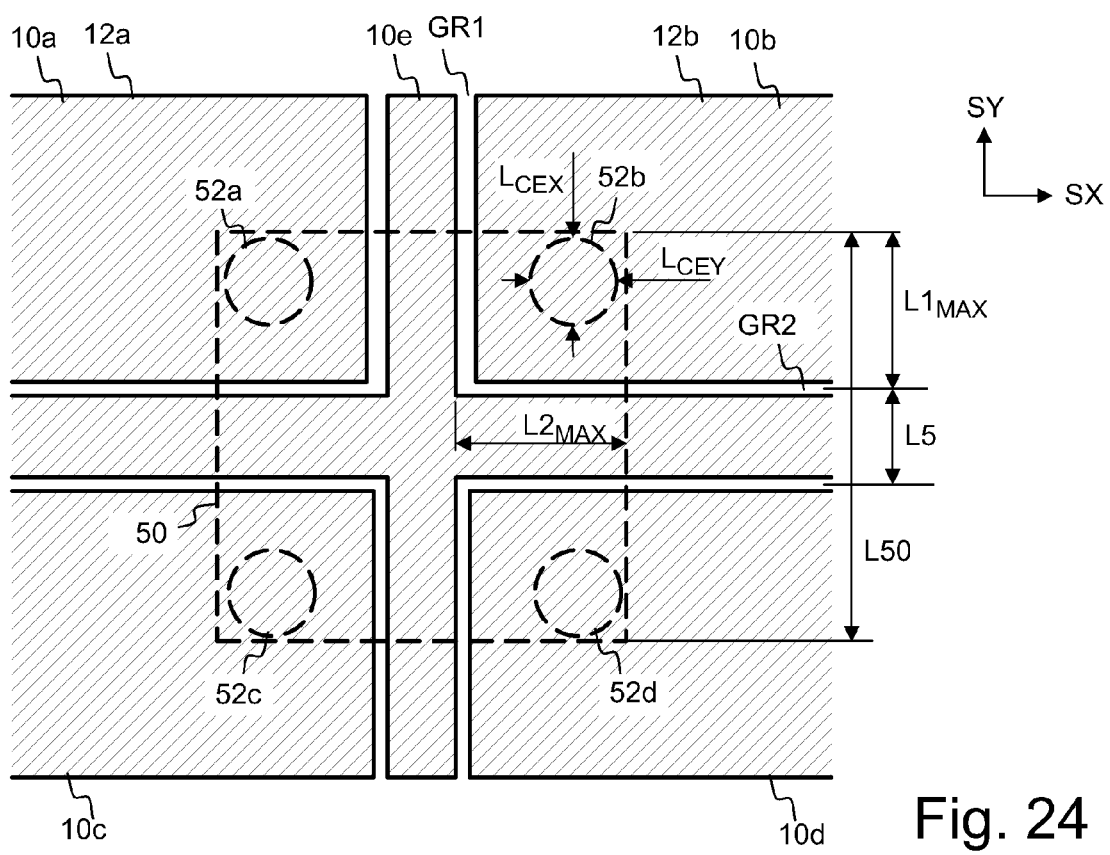
FIG. 24 shows, in a top view, a cutting pattern for providing a reduced reach dimension.

Referring to FIG. 24, the antenna elements 10a, 10b may be separated from each other by using tilted laser beams LB1, LB2 also when the width L50 of the chip 50 is greater than the sum of the maximum reach dimensions $L1_{MAX}$+$L2_{MAX}$.

The grooves GR1, GR2 may be formed e.g. when a first dimension $L_{CEY}$ of a contact element 52b in the direction SY is smaller than the maximum reach dimension $L1_{MAX}$ in the direction SY and when a second dimension $L_{CEX}$ of said contact element 52b in the direction SX is smaller than the maximum reach dimension $L2_{MAX}$ in the direction SX.

Also in this case, the adjoining grooves GR1, GR2 may be formed without significantly exposing to chip 50 to the tilted laser beams LB1, LB2 used for cutting the grooves GR1, GR2.

In case of FIG. 24, the dimension L50 may be greater than two times the maximum reach dimension $L1_{MAX}$. L5 denotes a dimension of residual portion 10e cut from the conductive sheet 70. The residual portion 10e may be removed after cutting.

Referring to FIG. 25a, a longer groove separating two antenna elements 10a, 10b may be formed by joining two shorter grooves GR1, GR2.

Figure 25B:
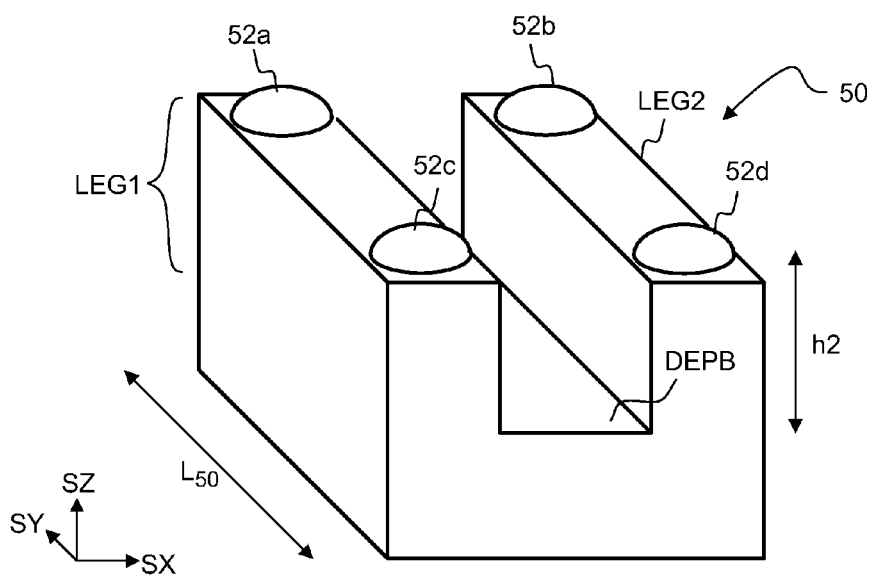
FIG. 25b shows, in a three-dimensional view, a chip having a recessed bottom portion and two legs.

Referring to FIG. 25b and the formula $L1_{MAX}$=h2·tan(α1), the maximum reach dimension $L1_{MAX}$ and/or $L2_{MAX}$ may be increased by increasing the dimension (height) h2. The dimension h2 may be increased by increasing the height of the contact elements 52a, 52b, 52c, 52d and/or by using a chip 50, which has leg portions LEG1, LEG2. The chip 50 may have a recessed (depressed) bottom portion DEPB located between two or more leg portions LEG1, LEG2.

Figure 25C:
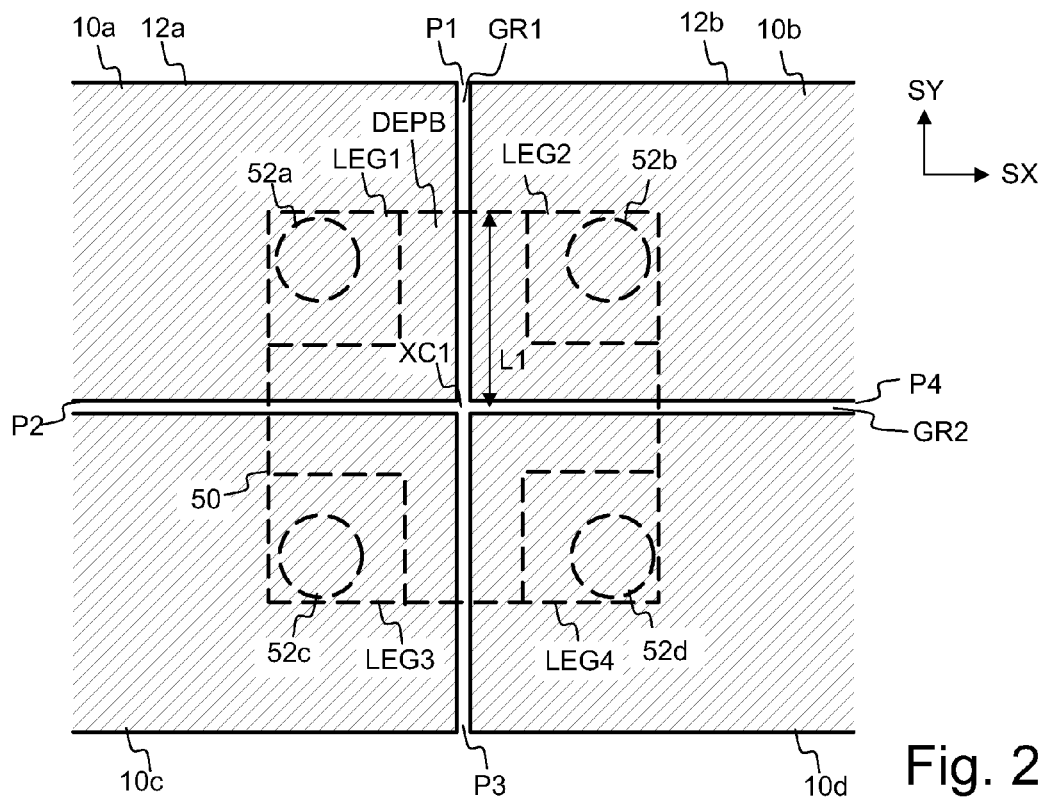
FIG. 25c shows, in a top view, a cutting pattern for providing four antenna portions.

Referring to FIG. 25c, three or more separated antenna elements or portions 10a, 10b, 10c, 10d may be formed by cutting a second groove, which is joined to a first groove at a branching point XC1. The first groove may be cut e.g. from the point P1 to the point P3, and the second groove may be cut e.g. from the point P2 to the point P4.

When using a tilted beam LB1 for cutting, damaging the chip 50 by the cutting beam LB1 may be substantially avoided, provided that the distance L1 of the branching point XC1 from the edge of the chip 50 (in the direction SY) is smaller than the maximum reach dimension $L1_{MAX}$.

The maximum reach dimension $L1_{MAX}$ may be increased by increasing the dimension h2 (FIGS. 23a, 23b).

Figure 25D:
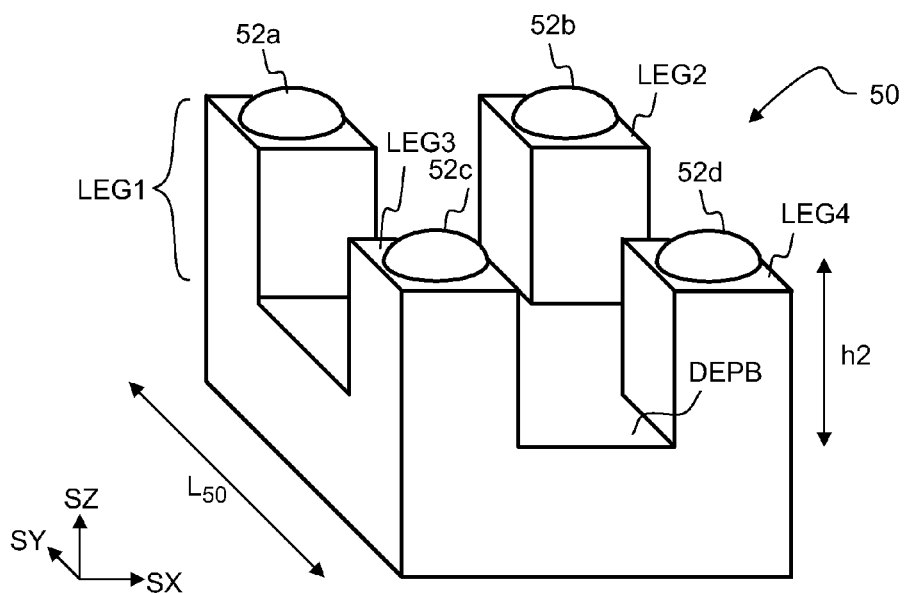
FIG. 25d shows, in a three-dimensional view, a chip having a recessed bottom and four legs.

Referring to FIG. 25d, the dimension h2 may be increased by increasing the height of the contact elements 52a, 52b, 52c, 52d and/or by using a chip 50, which has leg portions LEG1, LEG2, LEG3, LEG4. The chip 50 may have a recessed bottom portion DEPB located between two or more leg portions LEG1, LEG2, LEG3, LEG4.

Referring to FIG. 26, metal particles MF1 and/or metal oxide particles MF1 may be formed during cutting with the laser beam LB1. The particles MF1 may be solid, partially molten, or completely in the molten state. The presence of the particles MF1 in the space between the antenna elements 10a, 10b and the chip may increase the risk of short-circuiting the antenna elements and/or may have an adverse effect on the impedance of the antenna elements. In particular, the presence of conductive particles MF1 in the space between the antenna elements 10a, 10b and the chip may increase the risk of short-circuiting.

It may be advantageous to remove particles from the space between the antenna elements 10a, 10b and the chip 50. It may be advantageous to prevent movement of particles to the space between the antenna elements 10a, 10b and the chip 50.

A gas stream G6 delivered via a nozzle 259 may be arranged to blow particles MF1 away from the groove and/or away from the laser spot SP1. In particular, the gas G6 ejected from the nozzle 259 may create a region of low pressure, which induces a secondary gas stream G3. The secondary gas stream G3 may suck particles MF1 from the groove, substantially in a direction (SZ) which is away from the chip 50. The secondary stream G3 may be created by the gas stream G6 by the venture effect.

A gas stream G5 may be delivered to a space between the sheet 70 and the chip 50. The gas stream G5 may be arranged to cool the surface of the chip 50, the gas stream G5 may be arranged to blow or suck away particles MF1 from the space between the sheet 70 and the chip 50. In particular, the gas stream G5 may be arranged create a pressure difference, which creates and/or sustains a gas flow G3 through the groove.

The laser spot SP1 may be exposed to a gas ENVI having a certain composition. The chemical composition of the gas may be selected e.g. to oxidize the material of the conductive sheet 70, and/or to increase the optical absorbance of the material of the conductive sheet 70 (e.g. by an oxidation reaction).

Particles MF1 removed from the groove may also be intentionally oxidized in order to make the particles MF1 electrically insulating.

Alternatively, the chemical composition of the gas ENVI may be selected to prevent oxidation of the material of the conductive sheet 70. The gas may consist of substantially inert gas.

The gas flow rates may be kept below a predetermined value in order to prevent deformation of the antenna elements.

The one or more grooves GR1, GR2 cut by one or more laser beams LB1, LB2 may separate the conductive sheet 70 into two or more separate portions 10a, 10b. The one or more grooves may be located between a first connecting element 52 and a second connecting element 52b. The one or more grooves may separate a first terminal portion 12a of a first antenna element 10a from a second terminal portion 12b of a second antenna element 10b. Alternatively, the one or more grooves may separate a first terminal portion 12a of an antenna element CA1 from a second terminal portion 12b of said antenna element CA1.

In case of a dipole antenna, the one or more grooves may separate the terminal portions 12a, 12b such that the voltage of the first terminal portion 12a may be different from the voltage of the second terminal portion 12b. In particular, the one or more grooves may galvanically separate the antenna elements 10a, 10b. The one or more grooves may galvanically separate the terminal portions 12a, 12b of the antenna elements 10a, 10b.

In particular, the methods shown in FIGS. 18, 19, 20, 21, 22a, 22b, 22c, 22d, 22e, 22f, 23a, 23b, 24, 25a, 25c, 26 may be used when forming the terminal portions of a dipole antenna.

In case of an inductive antenna CA1, the one or more grooves may separate the terminal portions 12a, 12b such that the voltage of the first terminal portion 12a may be different from the voltage of the second terminal portion 12b. However, the first terminal portion 12a may still be galvanically connected to the second terminal portion by one or more turns TRN1, TRN2 of the inductive antenna CA1 (FIG. 13b).

In particular, the methods shown in FIGS. 18, 19, 20, 21, 22a, 22b, 23a, 23b, 25a, 25c, and 26 may be used when forming the terminal portions of an inductive antenna CA1.

Also the methods of FIGS. 22c, 22d, 22e, 22f, 24 may be used in case of a transponder having a coil antenna if it is desired to implement three or more separate electrical connections to the chip 50. For example, two contact pads of the chip may be connected to an auxiliary battery by using conductive strips cut from the sheet 70. For example, a transponder 100 may have two or more inductive antennae connected to the same chip 50. For example, a transponder 100 may have a dipole antenna 10a, 10b in addition to an coil antenna CA1.

FIGS. 5a, 5b, 18 to 24, 25a, 25c, and 26 show a relatively small portion of an antenna element or antenna elements in the vicinity of the chip 50. The terminal portions shown in FIGS. 5a, 5b, 18 to 24, 25a, 25c, and 26 are part of a larger antenna element CA1 or parts of larger antenna elements 10a, 10b.

When cutting the terminal portions 12a, 12b of the antenna elements 10a, 10b with the laser beam LB1, the accuracy may be high with respect to the position of the contact elements 52, 52b of the chip 50.

Cutting with the laser may be advantageous when compared with e.g. wet etching. By cutting the antenna elements with the laser, the manufacturing process may be environmentally friendly, because the use of e.g. etching chemicals may be avoided. Furthermore, the process may be simplified because there is no need to wash away residuals of etching chemicals. Furthermore, there is no need to recover material from the etching chemical.

By cutting the antenna elements with the laser, each individual transponder may be tuned based on measured RF performance of said transponder, if desired.

The intensity of laser radiation at the surface of the chip (50) may be arranged to be smaller than 10% of the maximum intensity of the laser beam (LB1) impinging on the conductive sheet (70), preferably smaller than 1%. The intensity may be reduced e.g. by using a diverging beam, by using scattering centers SC1, by using a tilted beam, by using a mask, and/or by using a sacrificial layer. Furthermore, the cutting parameters may be selected such that the width of the groove is substantially narrower than the width of the laser spot on the conductive sheet. Thus, the walls of the groove cut by the laser may operate as an attenuating element to reduce the intensity impinging on the chip.

The various aspects of the invention are illustrated by the following examples:

Example 1

A method for producing an RFID transponder (100), the method comprising:
attaching an RFID chip (50) onto a conductive sheet (70), and
cutting a portion (12a, 12b, 11) of an antenna element (10a, 10b, CA1) from the conductive sheet (70) after the RFID chip (50) has been attached onto the conductive sheet (70).

Example 2

The method of example 1 wherein the shape of the portion (12a, 12b, 11) is cut by using a laser beam (LB1).

Example 3

The method of example 1 or 2 comprising:
forming an electrical contact between an RFID chip (50) and a conductive sheet (70), and
cutting a portion (12a, 12b, 11) of an antenna element (10a, 10b, CA1) from the conductive sheet (70) after the electrical contact has been formed.

Example 4

The method of example 3 wherein the electrical contact is formed by using a laser beam (LB0).

Example 5

The method according to any of the examples 1 to 4 comprising:
forming a first set of slots (E1),
providing supporting elements (S1, MSH1) on the conductive sheet (70) such that the locations of the supporting elements (S1) substantially coincide with the locations of the slots (E1) of the first set of slots (E1), and
forming a second set of slots (E2) after the supporting elements (S1) have been provided.

Example 6

The method of example 5 wherein a material of the supporting elements (S1, MSH1) is an UV-curable lacquer.

Example 7

The method of example 5 wherein the supporting elements (S1) are laminated on the conductive sheet (70) after forming a first set of slots (E1) and before forming the second set of slots (E2).

Example 8

The method according to any of the examples 1 to 4 comprising forming a set of slots (E1) such that the antenna element (10, 10b) is connected to an outer portion (OR1) of the conductive sheet (70) by a plurality of links (72), wherein the links (72) substantially consist of the material of the conductive sheet (70).

Example 9

The method of example 8 wherein the thickness ($d_{72}$) of at least one link (72) is smaller than the thickness of the conductive sheet (70).

Example 10

The method according to any of the examples 1 to 4 comprising holding a portion of the conductive sheet (70) against a holding member (300) by a pressure difference (VAC1) during the cutting.

Example 11

The method according to any of the examples 1 to 10 comprising forming an antenna element (10a, 10b) of a dipole antenna.

Example 12

The method according to any of the examples 1 to 10 comprising forming an antenna element (CA1) of an inductive antenna.

Example 13

The method of example 12 wherein at least one turn (TRN1) of a coil antenna element (CA1) is arranged to pass through a space between terminal portions (12a,12b) of the coil antenna element (CA1).

Example 14

An apparatus (200) for producing an RFID transponder (100), wherein the apparatus (200) is arranged:
  to attach an RFID chip (50) onto a conductive sheet (70), and
  to cut a portion (12a, 12b, 11) of an antenna element (10a, 10b, CA1) from the conductive sheet (70) after the RFID chip (50) has been attached onto the conductive sheet (70).

Example 15

A device, comprising an RFID chip 50 connected to at least one antenna element (10a, 10b, CA1), wherein the antenna element (10a, 10b, CA1) is connected to a further portion (OR1) of a conductive sheet (70) by a plurality of links (72) and/or bridge elements (S1).

Example 16

The device of example 15 wherein the antenna element (10a, 10b) is an antenna element of a dipole antenna.

Example 17

The device of example 15 wherein the antenna element (CA1) is an antenna element of an inductive antenna.

Example 18

An RFID transponder (100) comprising an RFID chip 50 connected to at least one antenna element (10a, 10b, CA1), wherein less than 20% of the surface area of the antenna element (10a, 10b, CA1) is covered by a dielectric material.

For the person skilled in the art, it will be clear that modifications and variations of the devices and the methods according to the present invention are perceivable. The drawings are schematic. The particular embodiments described above with reference to the accompanying drawings are illustrative only and not meant to limit the scope of the invention, which is defined by the appended claims.

The invention claimed is:

1. A method for producing a radio frequency identification transponder, the method comprising:
  attaching a radio frequency identification chip onto a conductive sheet; and
  cutting a portion of an antenna element from the conductive sheet using a laser beam after the radio frequency identification chip has been attached to the conductive sheet sheet;
  forming a first electrical connection between a first contact element of the chip and the conductive sheet;
  forming a second electrical connection between a second contact element of the chip and the conductive sheet; and
  cutting a region of the conductive sheet located between said contact elements by at least one of heating or ablating the conductive material of the sheet with the laser beam after the electrical connections have been formed.

2. The method according to claim 1, wherein the laser beam is arranged to propagate through a groove cut in the conductive sheet such that an intensity of laser radiation at a surface of the chip is smaller than 10% of a maximum intensity of the laser beam during cutting the region of the conductive sheet located between said contact elements.

3. The method according to claim 2, wherein a part of the laser radiation impinges on the surface of the chip, and the intensity of the laser radiation impinging on the surface of the chip is limited to be smaller than or equal to 10% of the maximum intensity of the laser beam impinging on the conductive sheet.

4. The method according to claim 2, wherein a divergence angle of the laser beam and a distance between the conductive sheet and the chip have been selected such that a width of an area of the chip exposed to laser radiation is greater than three times a width of the laser spot on the conductive sheet.

5. The method according to claim 1, wherein the chip is attached to the conductive sheet by using an adhesive, and wherein said adhesive comprises light scattering centers arranged to reduce an intensity of laser radiation impinging on the chip.

6. The method according to claim 1, wherein cutting parameters during steady state cutting are selected such that a width of a groove cut by the laser beam is substantially narrower than a width of a laser spot at a surface of the conductive sheet such that the groove substantially reduces an intensity of laser radiation transmitted through the groove.

7. The method according to claim 1, wherein at least one branching point of grooves cut by the laser beam are located outside a projected area, wherein said projected area is a rectilinear parallel projection of the chip onto the conductive sheet.

8. The method according to claim 1, wherein an intensity of radiation at a surface of the chip is limited by using a mask located between the conductive sheet and the chip or by using a sacrificial layer located between the conductive sheet and the surface of the chip.

9. The method according to claim 1, further comprising:
forming a first set of slots;
providing supporting elements on the conductive sheet such that locations of the supporting elements substantially coincide with locations of the slots of the first set of slots, and
forming a second set of slots after the supporting elements have been provided.

10. The method according to claim 9, wherein a material of the supporting elements is a UV-curable lacquer.

11. The method according to claim 9, wherein the supporting elements are laminated on the conductive sheet after forming a first set of slots and before forming the second set of slots.

12. The method according to claim 1, further comprising:
forming a set of slots such that the antenna element is connected to an outer portion of the conductive sheet by a plurality of links, wherein the links comprise material of the conductive sheet.

13. The method according to claim 12, wherein a thickness of at least one link is smaller than a thickness of the conductive sheet.

14. The method according to claim 1, further comprising:
holding a portion of the conductive sheet against a holding member by a pressure difference during the cutting.

15. An apparatus for producing a radio frequency identification transponder, comprising:
a holder to dispense a radio frequency identification chip onto a conductive sheet,
a laser to provide a laser beam for cutting the conductive sheet, and
a holder configured to support an antenna element cut from the conductive sheet, wherein the apparatus is arranged:
to attach a radio frequency identification chip onto the conductive sheet, and
to cut a portion of an antenna element from the conductive sheet using the laser beam after the radio frequency identification chip has been attached to the conductive sheet,
to form a first electrical connection between a first contact element of the chip and the conductive sheet,
to form a second electrical connection between a second contact element of the chip and the conductive sheet, and
to cut a region of the conductive sheet located between said contact elements by at least one of heating or ablating the conductive material of the sheet with the laser beam after the electrical connections have been formed.

* * * * *